(12) United States Patent
Kimura et al.

(10) Patent No.: US 7,405,684 B2
(45) Date of Patent: Jul. 29, 2008

(54) SIGNAL SELECTING CIRCUIT AND RECORDING MEDIUM HAVING PROGRAM RECORDED THEREON

(75) Inventors: Shuji Kimura, Ota (JP); Wataru Kusumoto, Gunma (JP); Toru Arisaka, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/611,012

(22) Filed: Dec. 14, 2006

(65) Prior Publication Data

US 2007/0139245 A1 Jun. 21, 2007

(30) Foreign Application Priority Data

Dec. 15, 2005 (JP) .............................. 2005-361323

(51) Int. Cl.
*H03M 1/00* (2006.01)
(52) U.S. Cl. ...................... 341/141; 341/142; 341/155; 341/110
(58) Field of Classification Search ................. 341/141, 341/110, 155, 159, 142
See application file for complete search history.

(56) References Cited

U.S. PATENT DOCUMENTS

| | | | | |
|---|---|---|---|---|
| 6,154,161 A | * | 11/2000 | Leme et al. | 341/143 |
| 7,142,606 B2 | * | 11/2006 | Talwalkar et al. | 375/259 |
| 7,218,896 B1 | * | 5/2007 | Venkatesh | 455/73 |
| 7,242,335 B2 | * | 7/2007 | Rubin et al. | 341/141 |
| 2001/0052864 A1 | * | 12/2001 | Shimizu et al. | 341/141 |
| 2005/0010958 A1 | * | 1/2005 | Rakib et al. | 725/111 |
| 2006/0232461 A1 | * | 10/2006 | Felder | 341/161 |
| 2007/0279274 A1 | * | 12/2007 | Hsieh et al. | 341/155 |

FOREIGN PATENT DOCUMENTS

JP 2005-223505 8/2005

* cited by examiner

*Primary Examiner*—Linh V Nguyen
(74) *Attorney, Agent, or Firm*—SoCal IP Law Group LLP; Steven C. Sereboff; John E. Gunther

(57) ABSTRACT

A signal selecting circuit is disclosed which outputs a first and a second digital signals by converting a first and a second analog signals into digital signals, the first and the second analog signals being the same or different signals selected from a plurality of analog signals, the signal selecting circuit comprising: an analog signal selection circuit that, based on an analog selection signal, selects the first and the second analog signals from the plurality of analog signals; a first AD converter that converts the first analog signal outputted from the analog signal selection circuit into a third digital signal to output the third digital signal; a second AD converter that converts the second analog signal outputted from the analog signal selection circuit into a fourth digital signal to output the fourth digital signal; a digital signal selection circuit that, based on a digital signal, selectively outputs one or both of the third and the fourth digital signals as the first and the second digital signals; and a control circuit that, based on an output selection signal for selecting the first and the second digital signals, outputs the analog selection signal and the digital selection signal.

14 Claims, 14 Drawing Sheets

SIGNAL SELECTING CIRCUIT AND RECORDING MEDIUM HAVING PROGRAM RECORDED THEREON

CROSS-REFERENCE TO RELATED APPLICATION

This application claims the benefit of priority to Japanese Patent Application No. 2005-361323, filed Dec. 15, 2005, of which full contents are incorporated herein by reference.

BACKGROUND OF THE INVENTION

1. Field of the Invention

The present invention relates to a signal selecting circuit and a recording medium having a program recorded thereon.

2. Description of the Related Art

In recent car audio systems, music or voices from different sound sources have come to be outputted separately to front speakers and rear speakers (see, e.g., Japanese Patent Application Laid-open Publication No. 2005-223505). In such car audio systems, an analog selector has often been used for selecting sound sources to be outputted separately to the front speakers and the rear speakers from among a plurality of sound sources (analogue signals) such as a CD, an MD, and a radio.

FIG. 14 depicts a common example of the configuration of the analog selector for selecting sound sources to be outputted separately to the front speakers and the rear speakers. An analog selector 201 serves to select a sound source outputted to the front speakers and includes switches 211 and 212, resistors 213 to 215, and an operational amplifier 216. An analog selector 221 serves to select a sound source outputted to the rear speakers and includes switches 231 and 232, resistors 233 to 235, and an operational amplifier 236. Input signals A and B are fed as selectable sound sources to each of the analog selectors 201 and 221. For example, by turning the switch 211 on and the switch 212 off, the switch 231 off, and the switch 232 on, the input signal A is provided as output (analog output 1) to the front speakers and the output signal B is provided as output (analog output 2) to the rear speakers.

In this manner, use of the analog selectors 201 and 221 enables music or voices from different sound sources to be outputted separately to the front speakers and the rear speakers.

In the configuration of FIG. 14, however, when the same sound source as being selected by one of the front and the rear is selected by the other, the one not changing the sound source undergoes occurrence of a switching noise. Assume for example that the switches 211, 212, 231, and 232 are on, off, off, and on, respectively, so that the input signals A and B are provided as the analog outputs 1 and 2, respectively. It is further assumed that the switches 231 and 232 are turned on and off, respectively, to switch the signal provided as the analog output 2 to the input signal A provided as the analog output 1. At that time, a switching noise occurs due to the switch 231 on and propagates to the switch 211. Therefore, when the rear selects the same sound source as the front does, a nose will occur in the analog output 1 provided to the front speakers though the front does not change the sound source. Similarly, when the front selects the same sound source as the rear does, a nose will occur in the analog output 2 provided to the rear speakers though the rear does not change the sound source.

SUMMARY OF THE INVENTION

The present invention was conceived in view of the above problems and it is therefore the object of the present invention to provide a signal selecting circuit issuing a plurality of output signals selected and converted from a plurality of analog signals inputted, the circuit when changing an output signal, preventing a noise from occurring in another output signal unchanged.

In order to achieve the above object, according to an aspect of the present invention there is provided a signal selecting circuit outputting a first and a second digital signals by converting a first and a second analog signals into digital signals, the first and the second analog signals being the same or different signals selected from a plurality of analog signals, the signal selecting circuit comprising: an analog signal selection circuit that, based on an analog selection signal, selects the first and the second analog signals from the plurality of analog signals; a first AD converter that converts the first analog signal outputted from the analog signal selection circuit into a third digital signal to output the third digital signal; a second AD converter that converts the second analog signal outputted from the analog signal selection circuit into a fourth digital signal to output the fourth digital signal; a digital signal selection circuit that, based on a digital selection signal, selectively outputs one or both of the third and the fourth digital signals as the first and the second digital signals; and a control circuit that, based on an output selection signal for selecting the first and the second digital signals, outputs the analog selection signal and the digital selection signal.

When the control circuit receives the output selection signal for changing the second digital signal to the same signal as the first digital signal, in a state where the third digital signal is outputted as the first digital signal and where the fourth digital signal is outputted as the second digital signal, the control circuit may output the digital selection signal for outputting the third digital signal as the first and the second digital signals.

When the control circuit receives the output selection signal for changing the first digital signal to a signal different from the second digital signal, in a state where the third digital signal is outputted as the first and the second digital signals, the control circuit may output the analog selection signal for selecting as the second analog signal an analog signal corresponding to the first digital signal indicated by the output selection signal, without changing the first analog signal.

When the control circuit receives the output selection signal for changing the first digital signal to the same signal as the second digital signal, in a state where the third digital signal is outputted as the second digital signal and where the fourth digital signal is outputted as the first digital signal, the control circuit may output the digital selection signal for outputting the third digital signal as the first and the second digital signals.

When the control circuit receives the output selection signal for changing the first digital signal to a signal different from the second digital signal, in a state where the third digital signal is outputted as the second digital signal and where the fourth digital signal is outputted as the first digital signal, the control circuit may output the analog selection signal for selecting as the second analog signal an analog signal corresponding to the first digital signal indicated by the output selection signal, without changing the first analog signal.

When the control circuit receives the output selection signal for changing the second digital signal to a signal different from the first digital signal, in a state where the third digital signal is outputted as the first and the second digital signals, the control circuit may output: the analog selection signal for selecting as the second analog signal an analog signal corresponding to the second digital signal indicated by the output selection signal, without changing the first analog signal; and the digital selection signal for outputting the third digital signal as the first digital signal and outputting the fourth digital signal as the second digital signal.

When the control circuit receives the output selection signal for changing the first digital signal to a signal different from the second digital signal, in a state where the third digital signal is outputted as the first digital signal and where the fourth digital signal is outputted as the second digital signal, the control circuit may output the analog selection signal for selecting as the first analog signal an analog signal corresponding to the first digital signal indicated by the output selection signal.

When outputting the digital selection signal for outputting the third digital signal as the first and the second digital signals, the control circuit may power down an operation of the second AD converter.

In order to achieve the above object, according to another aspect of the present invention there is provided a recording medium having a program recorded thereon, the program causing a processor of a signal selecting circuit which includes the processor that performs control for outputting a first and a second digital signals by converting a first and a second analog signals into digital signals, the first and the second analog signals being the same or different signals selected from a plurality of analog signals, an analog signal selection circuit that, based on an analog selection signal, selects the first and the second analog signals from the plurality of analog signals, a first AD converter that converts the first analog signal outputted from the analog signal selection circuit into a third digital signal to output the third digital signal, a second AD converter that converts the second analog signal outputted from the analog signal selection circuit into a fourth digital signal to output the fourth digital signal, a digital signal selection circuit that, based on a digital selection signal, selectively outputs one or both of the third and the fourth digital signals as the first and the second digital signals, and a memory that stores a state of selection of the third and the fourth digital signals in the digital signal selection circuit, to execute the steps of: accepting an output selection signal for selecting the first and the second digital signals; outputting the analog selection signal and the digital selection signal based on the output selection signal accepted and on the state of selection stored in the memory; and updating the state of selection stored in the memory.

The program may cause the processor to execute the steps of: when accepting the output selection signal for changing the second digital signal to the same signal as the first digital signal, in a state where the third digital signal is outputted as the first digital signal and where the fourth digital signal is outputted as the second digital signal, outputting the digital selection signal for outputting the third digital signal as the first and the second digital signals; and updating the state of selection stored in the memory.

The program may cause the processor to execute the steps of: when accepting the output selection signal for changing the first digital signal to a signal different from the second digital signal, in a state where the third digital signal is outputted as the first and the second digital signals, outputting the analog selection signal for selecting as the second analog signal an analog signal corresponding to the first digital signal indicated by the output selection signal, without changing the first analog signal; and updating the state of selection stored in the memory.

The program may cause the processor to execute the steps of: when accepting the output selection signal for changing the first digital signal to the same signal as the second digital signal, in a state where the third digital signal is outputted as the second digital signal and where the fourth digital signal is outputted as the first digital signal, outputting the digital selection signal for outputting the third digital signal as the first and the second digital signals; and updating the state of selection stored in the memory.

The program may cause the processor to execute the step of, when accepting the output selection signal for changing the first digital signal to a signal different from the second digital signal, in a state where the third digital signal is outputted as the second digital signal and where the fourth digital signal is outputted as the first digital signal, outputting the analog selection signal for selecting as the second analog signal an analog signal corresponding to the first digital signal indicated by the output selection signal, without changing the first analog signal.

The program may cause the processor to execute the steps of: when accepting the output selection signal for changing the second digital signal to a signal different from the first digital signal, in a state where the third digital signal is outputted as the first and the second digital signals, outputting the analog selection signal for selecting as the second analog signal an analog signal corresponding to the second digital signal indicated by the output selection signal, without changing the first analog signal, and the digital selection signal for outputting the third digital signal as the first digital signal and outputting the fourth digital signal as the second digital signal; and updating the state of selection stored in the memory.

The program may cause the processor to execute the step of, when accepting the output selection signal for changing the first digital signal to a signal different from the second digital signal, in a state where the third digital signal is outputted as the first digital signal and where the fourth digital signal is outputted as the second digital signal, outputting the analog selection signal for selecting as the first analog signal an analog signal corresponding to the first digital signal indicated by the output selection signal.

The program may cause the processor to execute the step of outputting a signal for powering down an operation of the second AD converter, when outputting the digital selection signal for outputting the third digital signal as the first and the second digital signals.

The above and other features of the present invention will become more apparent from the following description of this specification together with the accompanying drawings.

BRIEF DESCRIPTION OF THE DRAWINGS

For thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

==Overall Configuration==

Figure 1:
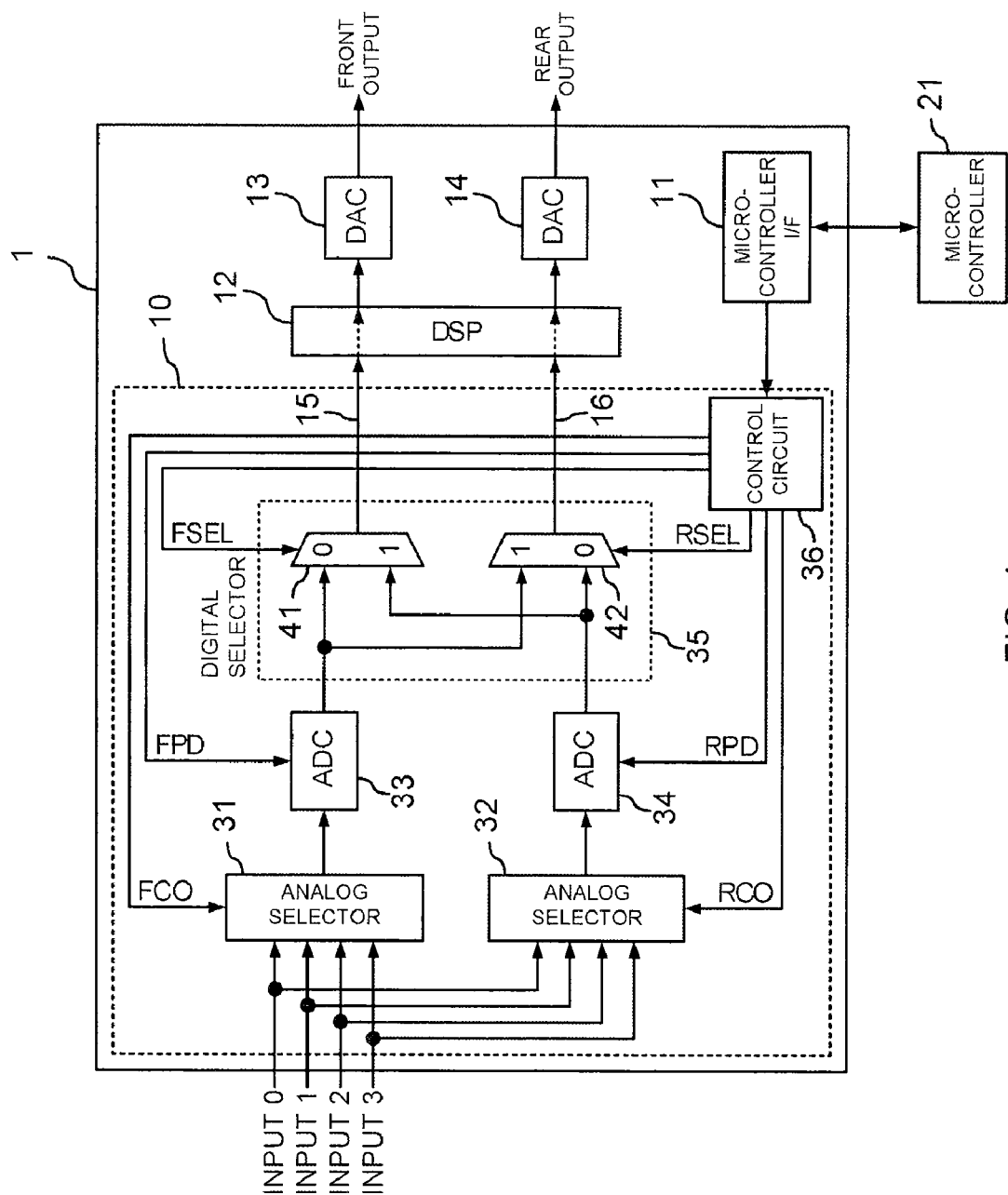
FIG. 1 depicts an exemplary configuration of a vehicle-mounted audio reproduction circuit configured to include a signal selecting circuit according to an embodiment of the present invention.

FIG. 1 depicts an exemplary configuration of a vehicle-mounted audio reproduction circuit configured to include a signal selecting circuit according to an embodiment of the present invention. The vehicle-mounted audio reproduction circuit generally designated at 1 includes the signal selecting circuit designated at 10, a microcontroller interface (microcontroller I/F) 11, a digital signal processor (DSP) 12, and a DA converters (DACs) 13 and 14.

The vehicle-mounted audio reproduction circuit 1 is a circuit that selects an analog signal (front output) to be outputted to front speakers and an analog signal (rear output) to be outputted to rear speakers from a plurality of analog signals (inputs 0 to 3 in this example) inputted from sound sources such as a CD, an MD, and a radio in accordance with instructions from a microcontroller 21.

A control signal from the microcontroller 21 is fed via the microcontroller I/F 11 to the signal selecting circuit 10. The control signal is capable of specifying which sound sources to be provided as the front output and the rear output, respectively. For example, the control signal is capable of specifying the input 0 (e.g., the CD) as the front output and the input 2 (e.g., the radio) as the rear output. Based on the control signal, the signal selecting circuit 10 issues a signal (first digital signal) 15 that is obtained by digitally converting a sound source selected as the front output and a signal (second digital signal) 16 that is obtained by digitally converting a sound source selected as the rear output.

The first digital signal 15 fed from the signal selecting circuit 10 is subjected to an audio process, etc., by the DSP 12 and then is converted into an analog signal by the DAC 13 to be provided as the front output. In the same manner, the second digital signal 16 fed from the signal selecting circuit 10 is subjected to an audio process, etc., by the DSP 12 and then is converted into an analog signal by the DAC 14 to be provided as the rear output.

The configuration of the signal selecting circuit 10 will hereinbelow be described. The signal selecting circuit 10 includes analog selectors 31 and 32, AD converters (ADCs) 33 and 34, a digital selector 35, and a control circuit 36. The analog selectors 31 and 32 correspond to an analog signal selecting circuit of the present invention. The ADCs 33 and 34 correspond to a first and a second AD converters, respectively, of the present invention. The digital selector 35 corresponds to a digital signal selecting circuit of the present invention.

A plurality of analog signals (inputs 0 to 3 in this example) are fed as sound sources to the analog selector 31 (a first analog signal selecting circuit), any one (a first analog signal) of which analog signals is selected for output based on a control signal FCO (a first selection signal) fed from the control circuit 36. The same analog signals (the inputs 0 to 3 in this example) are fed also to the analog selector 32 (a second analog signal selecting circuit), any one (a second analog signal) of which analog signals is selected for output based on a control signal RCO (a second selection signal) fed from the control circuit 36. Although in this example exactly the same signals are fed to both the analog selectors 31 and 32, at least one common analog signal needs only to be fed thereto. For example, the inputs 0 and 1 may be fed to the analog selector 31, while the inputs 0, 2 and 3 may be fed to the analog selector 32. The control signals FCO and RCO correspond to an analog selection signal of the present invention.

The ADC 33 converts the analog signal (the first analog signal) fed from the analog selector 31 into a digital signal (a third digital signal) for output. Similarly, the ADC 34 converts the analog signal (the second analog signal) fed from the analog selector 32 into a digital signal (a fourth digital signal) for output. A control signal FPD fed from the control circuit 36 is fed to the ADC 33, while a control signal RPD from the control circuit 36 is fed to the ADC 34. In case of the control signal FPD being 1, the operation of the ADC 33 is powered down whereas in case of the control signal RPD being 1, the operation of the ADC 34 is powered down.

The third and the fourth digital signals from the ADCs 33 and 34, respectively, are fed to the digital selector 35 so that based on control signals FSEL and RSEL (a digital selection signal) fed from the control circuit 36 the digital selector 35 outputs either the third or the fourth digital signal as the first digital signal 15 and as the second digital signal 16. More specifically, the digital selector 35 includes selection circuits 41 and 42 receiving the third and the fourth digital signals. The selection circuit 41 receives the control signal FSEL fed from the control circuit 36, and in case of the FSEL being 0, outputs the third digital signal fed from the ADC 33 as the first digital signal 15, but in case of the FSEL being 1, outputs the fourth digital signal fed from the ADC 34 as the first digital signal 15. The selection circuit 42 receives the control signal RSEL fed from the control circuit 36, and in case of the RSEL being 0, outputs the fourth digital signal fed from the ADC 34 as the second digital signal 16, but in case of the RSEL being 1, outputs the third digital signal fed from the ADC 33 as the second digital signal 16.

The control circuit 36 stores the states of selection of the analog selectors 31 and 32 and of the digital selector 35, and provides the control signals FCO, RCO, FPD, RPD, FSEL, and RSEL as its outputs to the respective circuits based on a control signal for changing the front output and the rear output fed via the microcontroller I/F 11.

Figure 2:
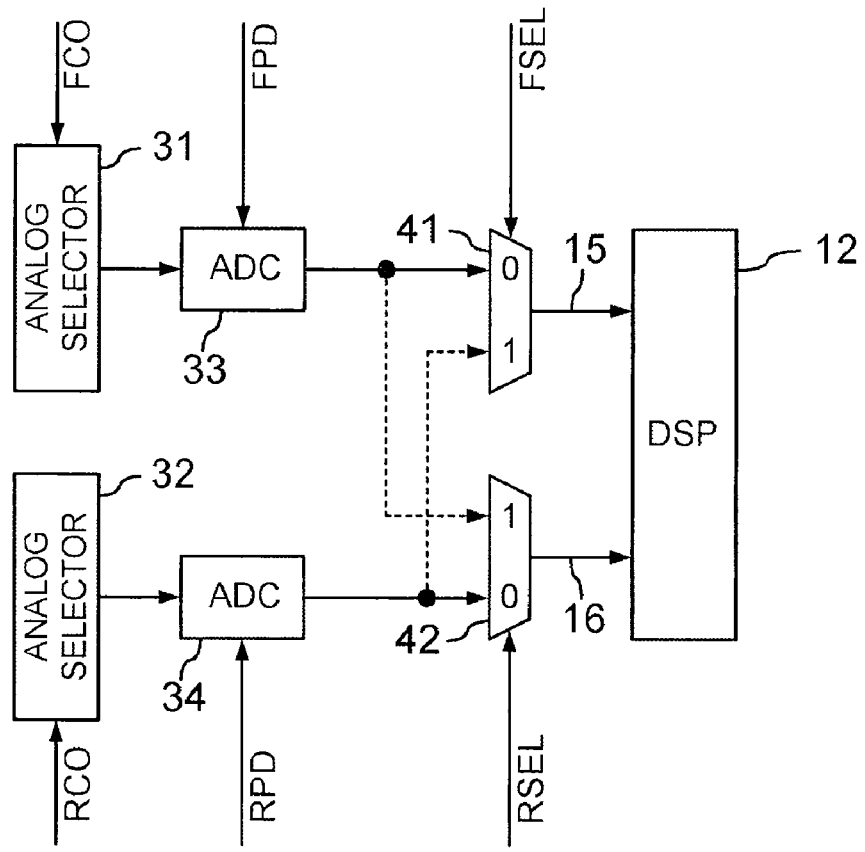
FIG. 2 depicts a first state of selection.

Description will then be made of the state of selection of the digital selector 35 in the signal selecting circuit 10. FIG. 2 depicts a first state of selection. As shown, the selection circuit 41 outputs the third digital signal fed from the ADC 33 as the first digital signal 15, while the selection circuit 42 outputs the fourth digital signal fed from the ADC 34 as the second digital signal 16. In this embodiment, the state of selection shown in FIG. 2 is referred to as a normal state. In the normal state, a sound source selected by the analog selector 31 is outputted from the front speakers, while a sound source selected by the analog selector 32 is outputted from the rear speakers.

Figure 3A:
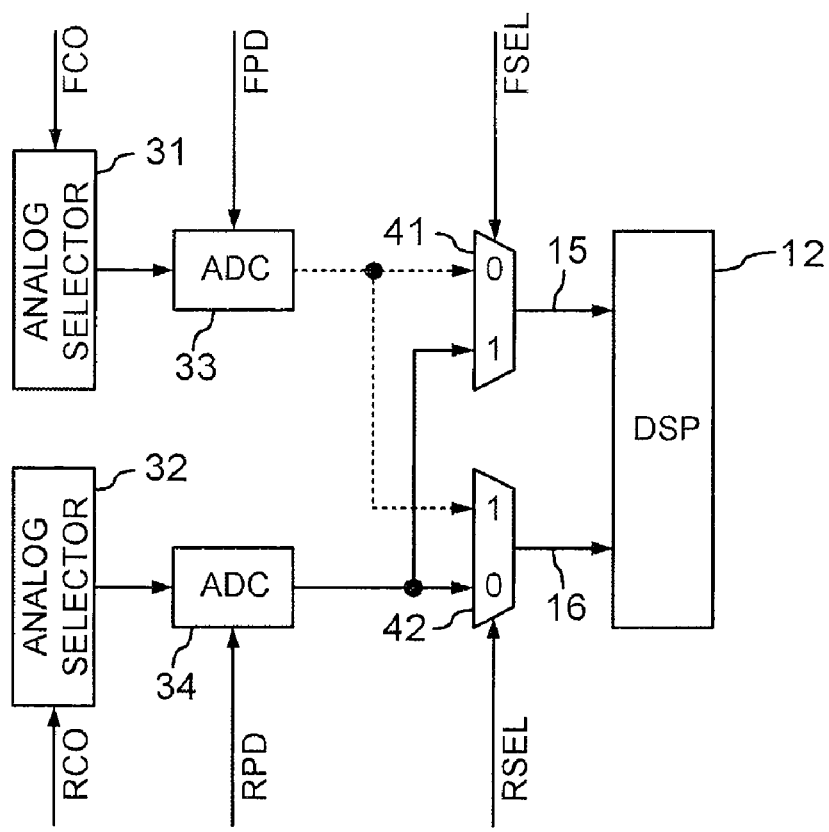
FIGS. 3A and 3B depict a second state of selection.
Figure 3B:
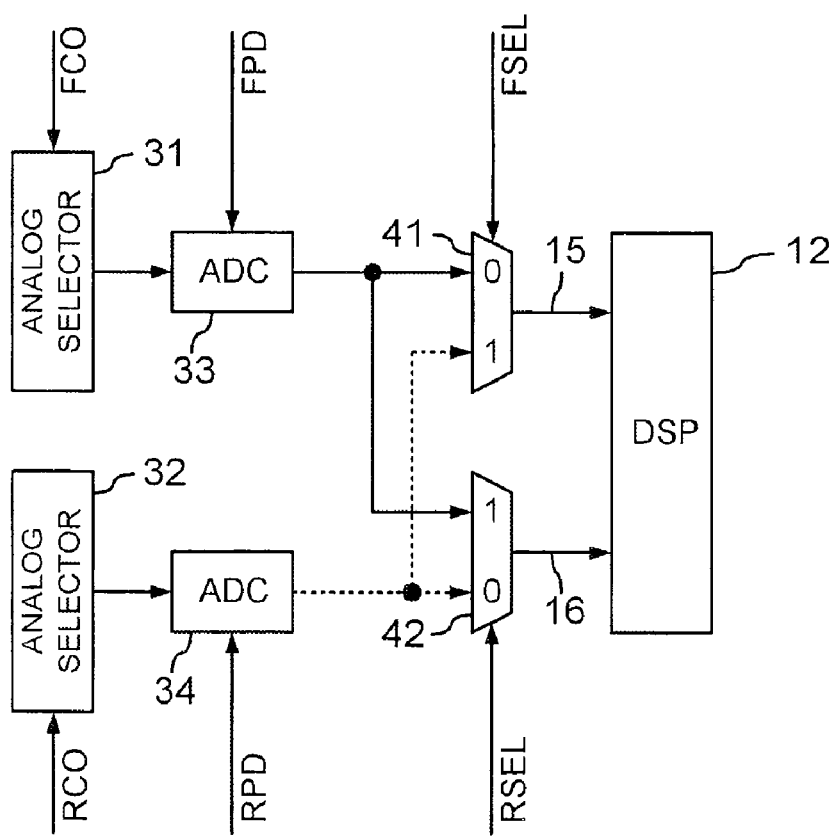

FIGS. 3A and 3B depict a second state of selection. As shown in FIG. 3A, the selection circuit 41 outputs the fourth digital signal fed from the ADC 34 as the first digital signal 15, while the selection circuit 42 outputs the fourth digital signal fed from the ADC 34 as the second digital signal 16. Since the third digital signal fed from the ADC 33 is not required in this case, the operation of the ADC 33 can be powered down by setting the control signal FPD to 1 for example. In FIG. 3B on the other hand, the selection circuit 41 outputs the third digital signal fed from the ADC 33 as the first digital signal 15, while the selection circuit 42 outputs the third digital signal fed from the ADC 33 as the second digital signal 16. Since the fourth digital signal fed from the ADC 34 is not required in this case, the operation of the ADC 34 can be powered down by setting the control signal RPD to 1 for example. In this embodiment, the states of selection shown in FIGS. 3A and 3B are referred to as a branch state. In the branch state, a sound source selected by the analog selector 31 or 32 is outputted from the front speakers and from the rear speakers.

Figure 4:
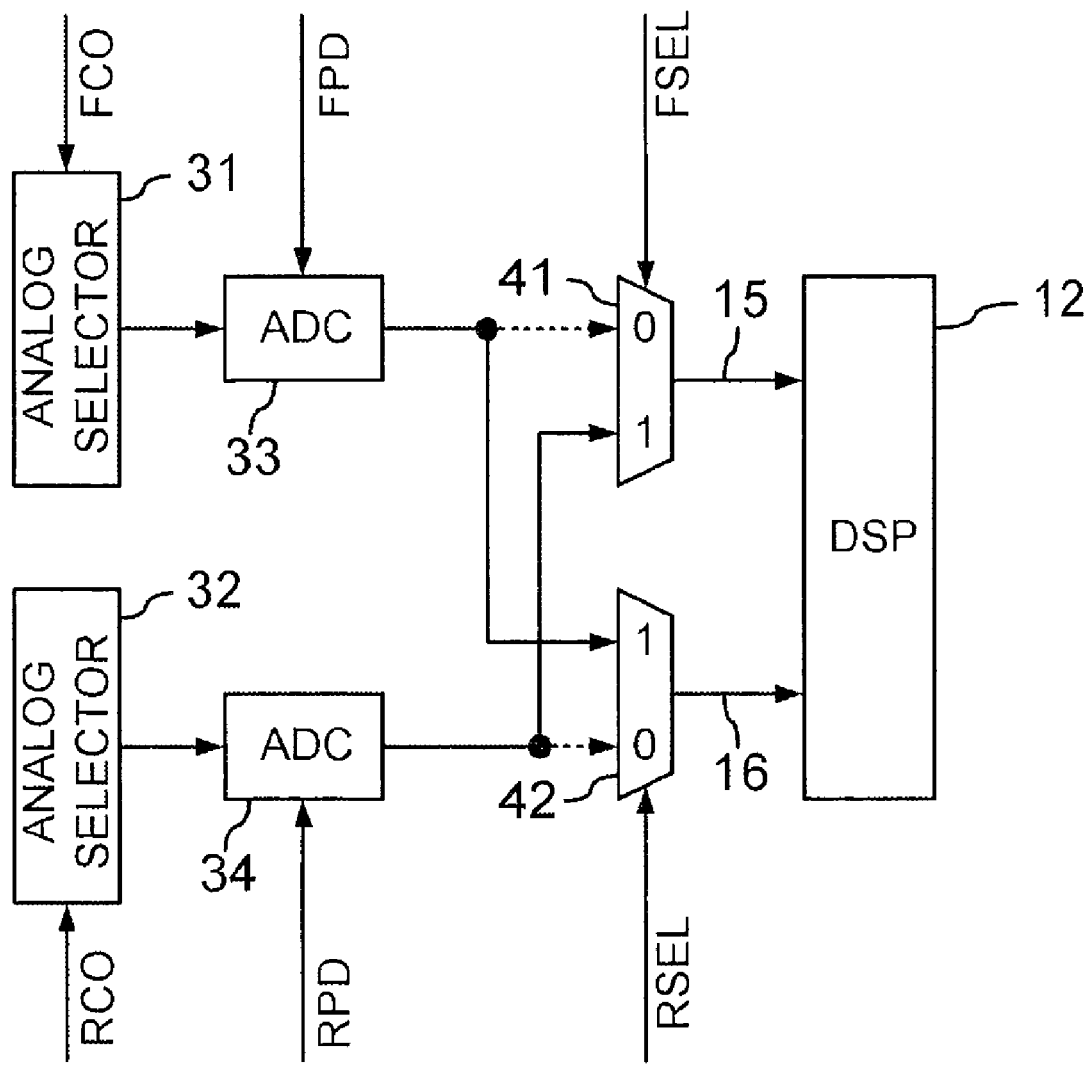
FIG. 4 depicts a third state of selection.

FIG. 4 depicts a third state of selection. As shown, the selection circuit 41 outputs the fourth digital signal fed from the ADC 34 as the first digital signal 15, while the selection circuit 42 outputs the third digital signal fed from the ADC 33 as the second digital signal 16. In this embodiment, the state of selection shown in FIG. 4 is referred to as a cross state. In the cross state, a sound source selected by the analog selector 32 is outputted from the front speakers, while a sound source selected by the analog selector 31 is outputted from the rear speakers.

Figure 5:
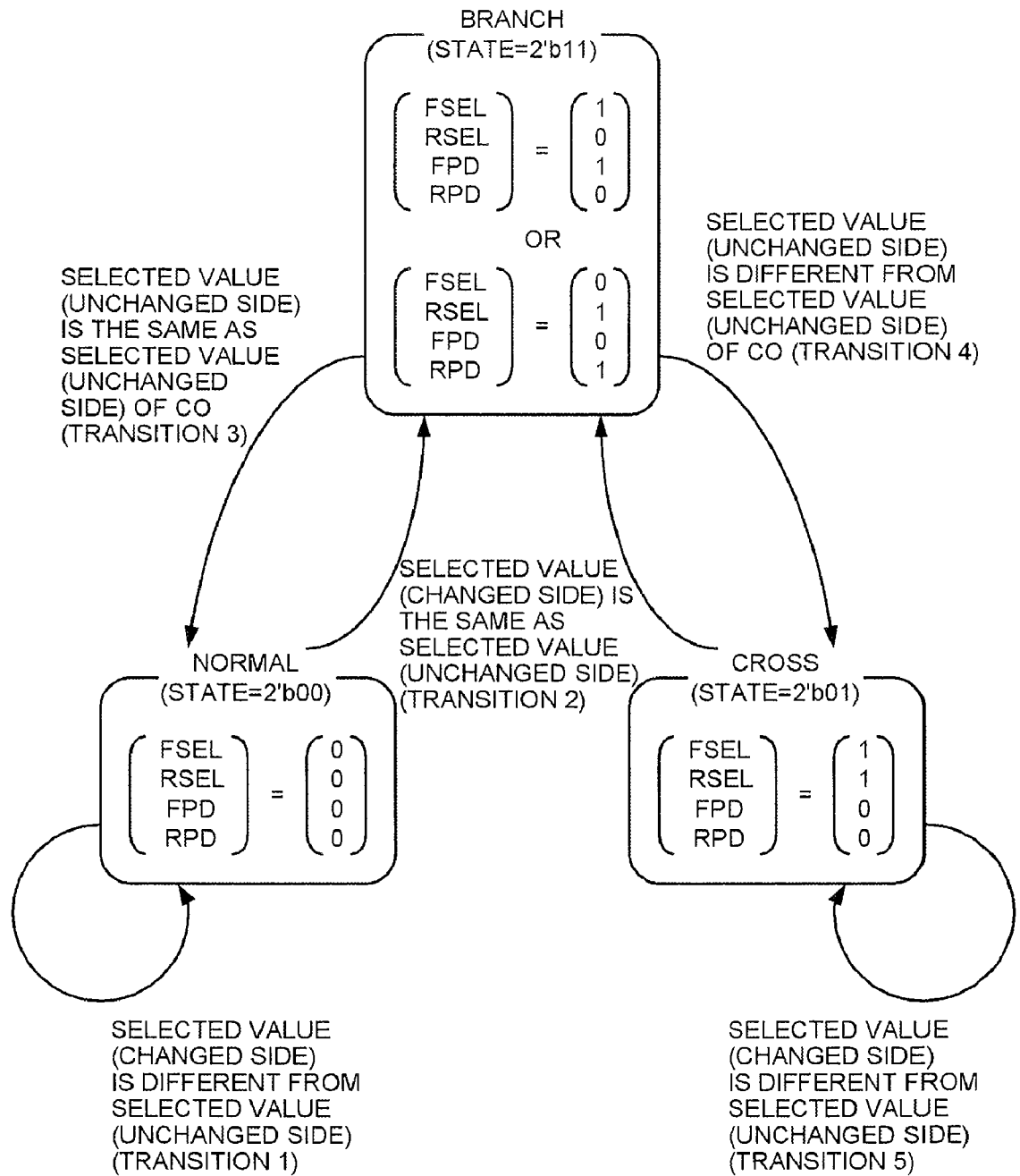
FIG. 5 depicts transitions in the states of selection of a digital selector.

Description will then be made of the transitions in the states between the normal state, the branch state, and the cross state. FIG. 5 depicts the transitions in the states of selection of the digital selector. In this embodiment, the state of selection is represented by e.g., a 2-bit binary number, with the normal state, the branch state, and the cross state being represented as "00", "11" and "01", respectively.

When the initial state is the normal state, the control signals FSEL and RSEL are both 0 so that the third digital signal fed from the ADC 33 is outputted as the first digital signal 15 and that the fourth digital signal fed from the ADC 34 is outputted as the second digital signal 16. Since the ADCs 33 and 34 are both in operation, the control signals FPD and RPD are 0. The state transitions are as follows when a control signal for changing either the front output or the rear output is received from the microcontroller 21 in the initial state. First, in case the sound source to be outputted to the changed side is different from the sound source being outputted to the unchanged side, the state of selection remains unchanged, i.e., in the normal state (transition 1). On the contrary, in case the sound source to be outputted to the changed side is the same as the sound source being outputted to the unchanged side, the state of selection transitions to the branch state (transition 2).

Since in the branch state the digital signal fed from the ADC 33 or 34 is outputted as the first digital signal 15 and as the second digital signal 16, the control signals (FSEL, RSEL, FPD, RPD) result in either (1, 0, 1, 0) or (0, 1, 0, 1). In this manner, when the state of selection is changed from the state where the front output and the rear output are different from each other (normal state) to the state where the front output and the rear output are the same (branch state), the change of the sound source to be outputted is carried out by switching the digital selector 35 instead of switching the analog selectors 31 and 32. That is, since the same sound source is not selected by the analog selectors 31 and 32, a noise attendant on the switching operation of one of the analog selectors 31 and 32 will not propagate to the other.

The state transitions are as follows when a control signal for changing either the front output or the rear output is received from the microcontroller 21 in the branch state. First, in case the sound source outputted to the unchanged side (the front or the rear) is the same as the sound source being selected by the corresponding analog selector 31 or 32, the state of selection transitions to the normal state (transition 3). On the contrary, in case the sound source being outputted to the unchanged side (the front or the rear) is different from the sound source selected by the corresponding analog selector 31 or 32, the state of selection transitions to the cross state (transition 4).

More specifically, assume for example that a control signal for changing the front output is received in the branch state of FIG. 3A. In such a case, the sound source being provided as the unchanged rear output is the same as the sound source selected by the corresponding analog selector 32, thus transitioning to the normal state. On the other hand, assume for example that a control signal for changing the rear output is received in the branch state of FIG. 3A. In such a case, the sound source being provided as the unchanged front output is different from the sound source selected by the corresponding analog selector 31, thus transitioning to the cross state. In this case, switching of the analog selector 32 is not carried out so that the sound source selected by the analog selector 32 continues to be provided as the front output. Thus, by enabling the transition from the branch state to the cross state, a switching noise will not occur on the side where the sound source is not changed.

The state transitions are as follows when a control signal for changing either the front output or the rear output is received from the microcontroller 21 in the cross state. First, in case the sound source to be outputted to the changed side is different from the sound source being outputted to the unchanged side, the state of selection remains unchanged, i.e., in the cross state (transition 5). On the contrary, in case the sound source to be outputted to the changed side is the same as the sound source being outputted to unchanged side, the state of selection transitions to the branch state (transition 2). In this manner, when the state of selection is changed from the state where the front output and the rear output are different from each other (cross state) to the state where the front output and the rear output are the same (branch state), the change of the sound source to be outputted is carried out by switching the digital selector 35 instead of switching the analog selectors 31 and 32. That is, since the same sound source is not selected by the analog selectors 31 and 32, a noise attendant on the switching operation of one of the analog selectors 31 and 32 will not propagate to the other.

==Control Circuit==

Figure 6:
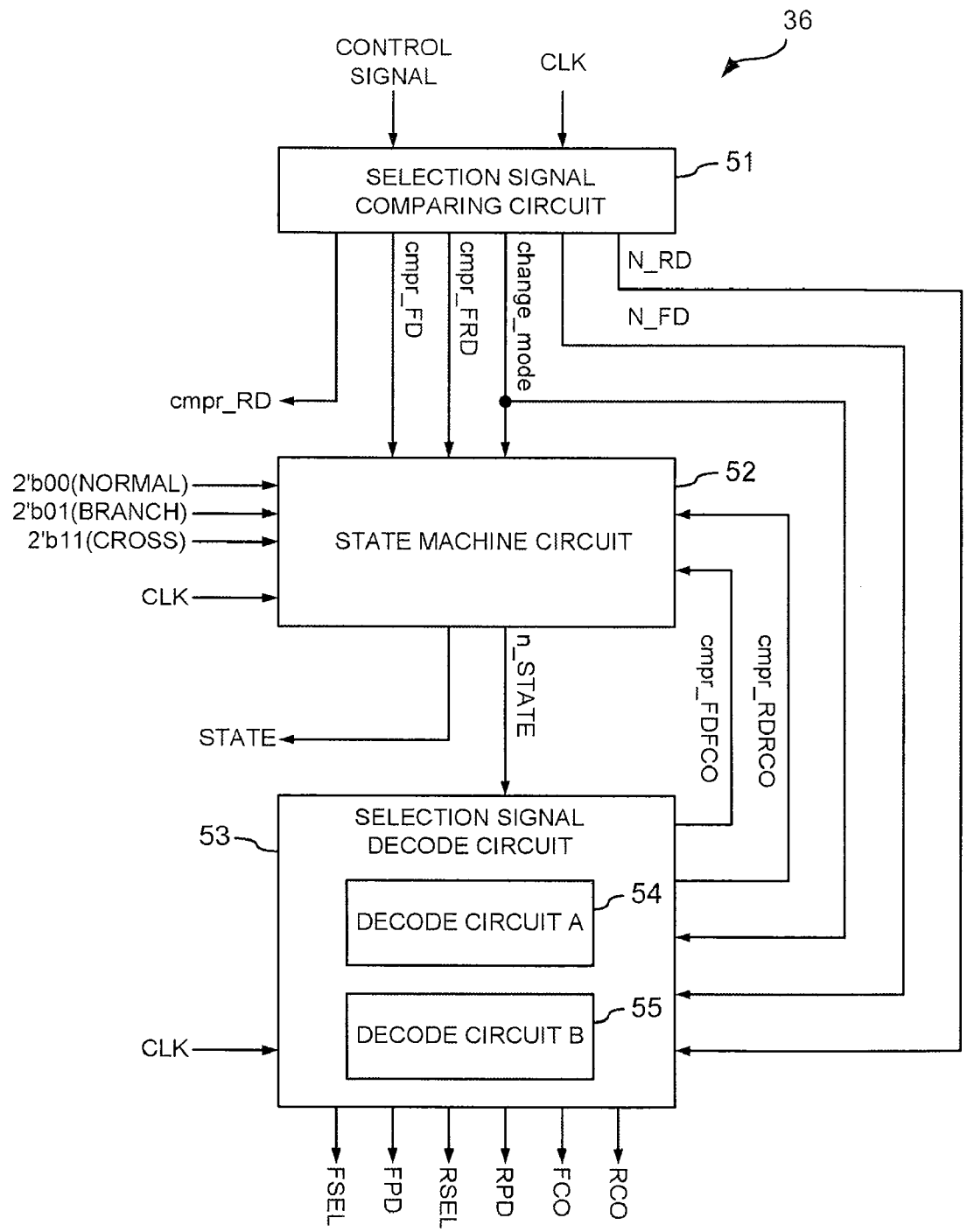
FIG. 6 is a block diagram of an exemplary configuration of a control circuit.

Description will then be made of the configuration of the control circuit 36 for implementing the state transitions as shown in FIG. 5. FIG. 6 is a block diagram of an exemplary configuration of the control circuit 36. The control circuit 36 is configured to include a selection signal comparing circuit 51, a state machine circuit 52, and a selection signal decode circuit 53.

The selection signal comparing circuit 51 receives a control signal sent from the microcontroller 21. Based on the control signal, the selection signal comparing circuit 51 issues signals N_FD, N_RD, cmpr_FD, cmpr_RD, cmpr_FRD, and change_mode.

The signal N_FD is a signal indicative of a sound source of the front output changed and the signal N_RD is a signal indicative of a sound source of the rear output changed.

The signal cmpr_FD is a signal indicative of a change of the front output and which changes e.g., from low to high when the front output is changed. The signal cmpr_RD is a signal indicative of a change of the rear output and which changes from low to high when the rear output is changed. The signal cmpr_FRD is a signal indicative of whether the changed front output (N_FD) and the changed rear output (N_RD) are the same or different and which is high if the signal N_FD and the signal N_RD are the same but low if they are different in this embodiment. The signal change_mode is a signal indicative of a change of either the front output or the rear output and which changes e.g., from low to high when the front output or the rear output is changed.

The state machine circuit 52 causes the state of selection to transition based on the signals cmpr_FD, cmpr_FRD, and change_mode fed from the selection signal comparing circuit 51 and on signals cmpr_FDFCO and cmpr_RDRCO fed from the selection signal decode circuit 53, and issues a signal STATE indicative of the state of selection and a signal n_STATE used to determine the next state of selection.

The selection signal decode circuit 53 receives the signals change_mode, N_FD, and N_RD fed from the selection signal comparing circuit 51, as well as the signal n_STATE fed from the state machine circuit 52. In response to those signals, the selection signal decode circuit 53 provides as its output the control signals FCO, RCO, FPD, RPD, FSEL, and RSEL for controlling the analog selectors 31 and 32, the ADCs 33 and 34, and the digital selector 35, respectively. The selection signal decode circuit 53 consists of a decode circuit A 54 and a decode circuit B 55.

Figure 7:
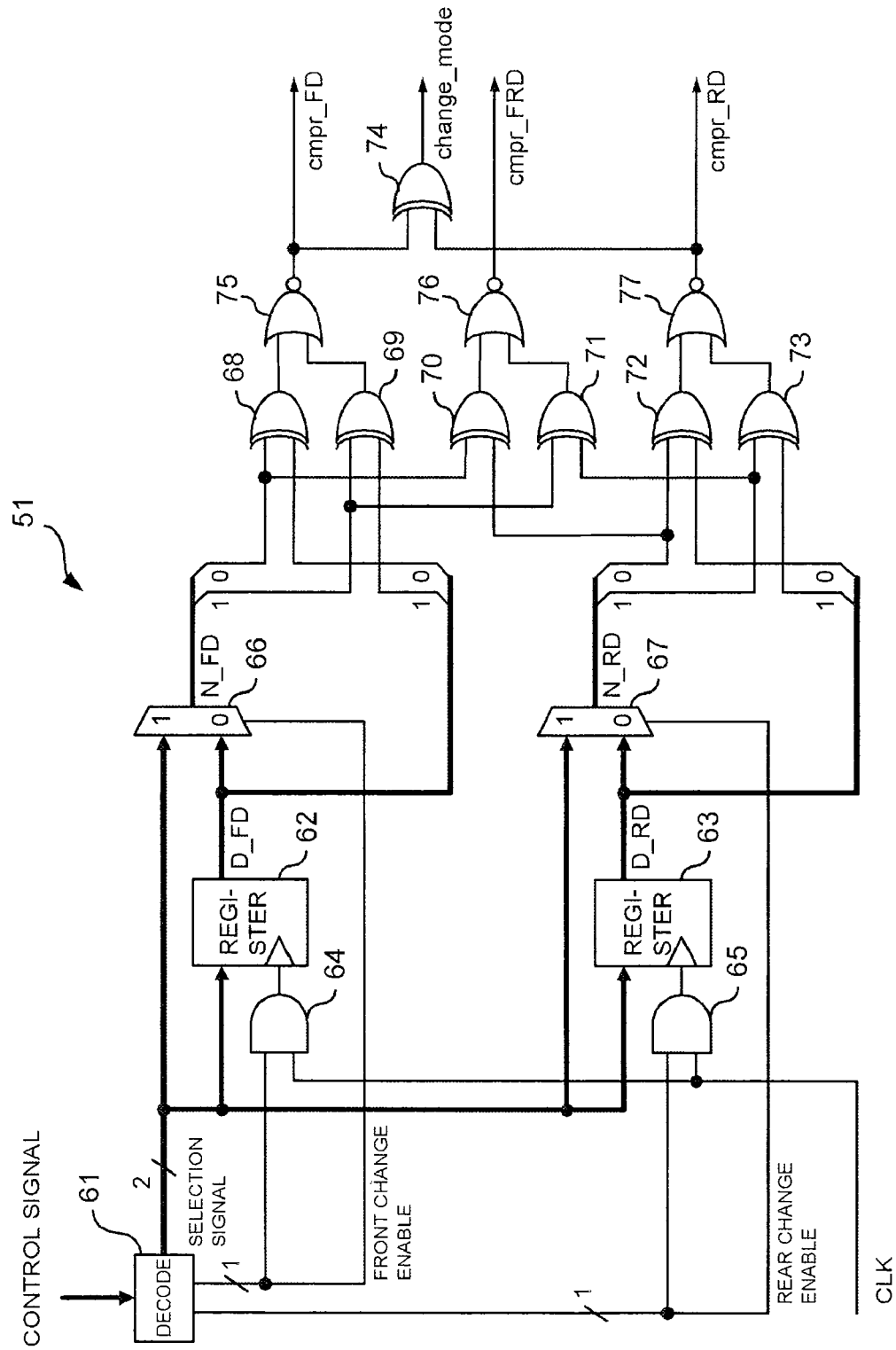
FIG. 7 is a circuit diagram of an exemplary configuration of a selection signal comparing circuit.

FIG. 7 is a circuit diagram of an exemplary configuration of the selection signal comparing circuit 51. The selection signal comparing circuit 51 is configured to include a decode circuit 61, registers 62 and 63, AND circuits 64 and 65, selecting circuits 66 and 67, XOR circuits 68 to 74, and NOR circuits 75 to 77.

The decode circuit 61 decodes a control signal fed from the microcontroller 21 into e.g., a 2-bit selection signal, e.g., a 1-bit front change enable signal, and e.g., a 1-bit rear change enable signal, for output. The selection signal is a signal for selecting the sound source of the front output or the rear output, the selection signal having in two bits for example "00" to be set when selecting the input 0, "01" for the input 1, "10" for the input 2, and "11" for the input 3. The front change enable signal is a signal indicative of an instruction to change the front output and is high only for one clock period for example. Similarly, the rear change enable signal is a signal indicative of an instruction to change the rear output and is high only for one clock period for example.

The register 62 holds a signal D_FD indicative of the sound source of the front output before change. The selection signal issued from the decode circuit 61 is fed to a data input of the register 62. The AND circuit 64 receives the front change enable signal and a clock signal CLK and provides its output to a clock input of the register 62. Since the front change enable signal is high only for one clock period of the clock signal CLK when the front output is changed, the selection signal from the decode circuit 61 is delivered to the register 62 at the timing when the clock signal CLK changes from low to high for example. The register 62 is comprised of a gated clock, and the signal D_FD changes at the next timing the clock signal CLK changes from low to high. On the contrary, since the front change enable signal is low when the rear output is changed, the signal D_FD held in the register 62 remains unchanged.

The register 63 holds a signal D_RD indicative of the sound source of the rear output before change. The selection signal issued from the decode circuit 61 is fed to a data input of the register 63. The AND circuit 65 receives the rear change enable signal and the clock signal CLK and provides its output to a clock input of the register 63. Since the rear change enable signal is high only for one clock period of the clock signal CLK when the rear output is changed, the selection signal from the decode circuit 61 is delivered to the register 63 at the timing when the clock signal CLK changes from low to high for example. The register 63 is also comprised of the gated clock, and the signal D_RD changes at the next timing the clock signal CLK changes from low to high. On the contrary, since the rear change enable signal is low when the front output is changed, the signal D_RD held in the register 63 remains unchanged.

The selecting circuit 66 receives the selection signal fed from the decode circuit 61 and the signal D_FD fed from the register 62. The selecting circuit 66 further receives the front change enable signal as a signal for selecting either of those signals. The selecting circuit 66 provides as its output the selection signal fed from the decode circuit 61 when the front change enable signal is high (1), whereas it provides as its output the signal D_FD fed from the register 62 when the front change enable signal is low (0). A signal fed from the selecting circuit 66 is designated at N_FD.

The selecting circuit 67 receives the selection signal fed from the decode circuit 61 and the signal D_RD fed from the register 63. The selecting circuit 67 further receives the rear change enable signal as a signal for selecting either of those signals. The selecting circuit 67 provides as its output the selection signal fed from the decode circuit 61 when the rear change enable signal is high (1), whereas it provides as its output the signal D_RD fed from the register 63 when the rear change enable signal is low (0). A signal fed from the selecting circuit 67 is designated at N_RD.

The XOR circuits 68 and 69, and the NOR circuit 75 are circuits comparing the signal N_FD with the signal D_FD, the NOR circuit 75 issuing the signal cmpr_FD indicative of the result of comparison. In this embodiment, the signal cmpr_FD goes high when the signals N_FD and D_FD are the same, whereas the signal cmpr_FD goes low when they are different.

The XOR circuits 72 and 73, and the NOR circuit 77 are circuits comparing the signal N_RD with the signal D_RD, the NOR circuit 77 issuing the signal cmpr_RD indicative of the result of comparison. In this embodiment, the signal cmpr_RD goes high when the signals N_RD and D_RD are the same, whereas the signal cmpr_RD goes low when they are different.

The XOR circuits 70 and 71, and the NOR circuit 76 are circuits comparing the signal N_FD with the signal N_RD, the NOR circuit 76 issuing the signal cmpr_FRD indicative of the result of comparison. In this embodiment, the signal cmpr_FRD goes high when the signals N_FD and N_RD are the same, whereas the signal cmpr_FRD goes low when they are different.

The signals cmpr_FD and cmpr_RD are fed to the XOR circuit 74 which in turn provides the signal change_mode as its output. Thus, the signal change_mode goes high only when either the signal cmpr_FD or the signal cmpr_RD is high.

Figure 8:
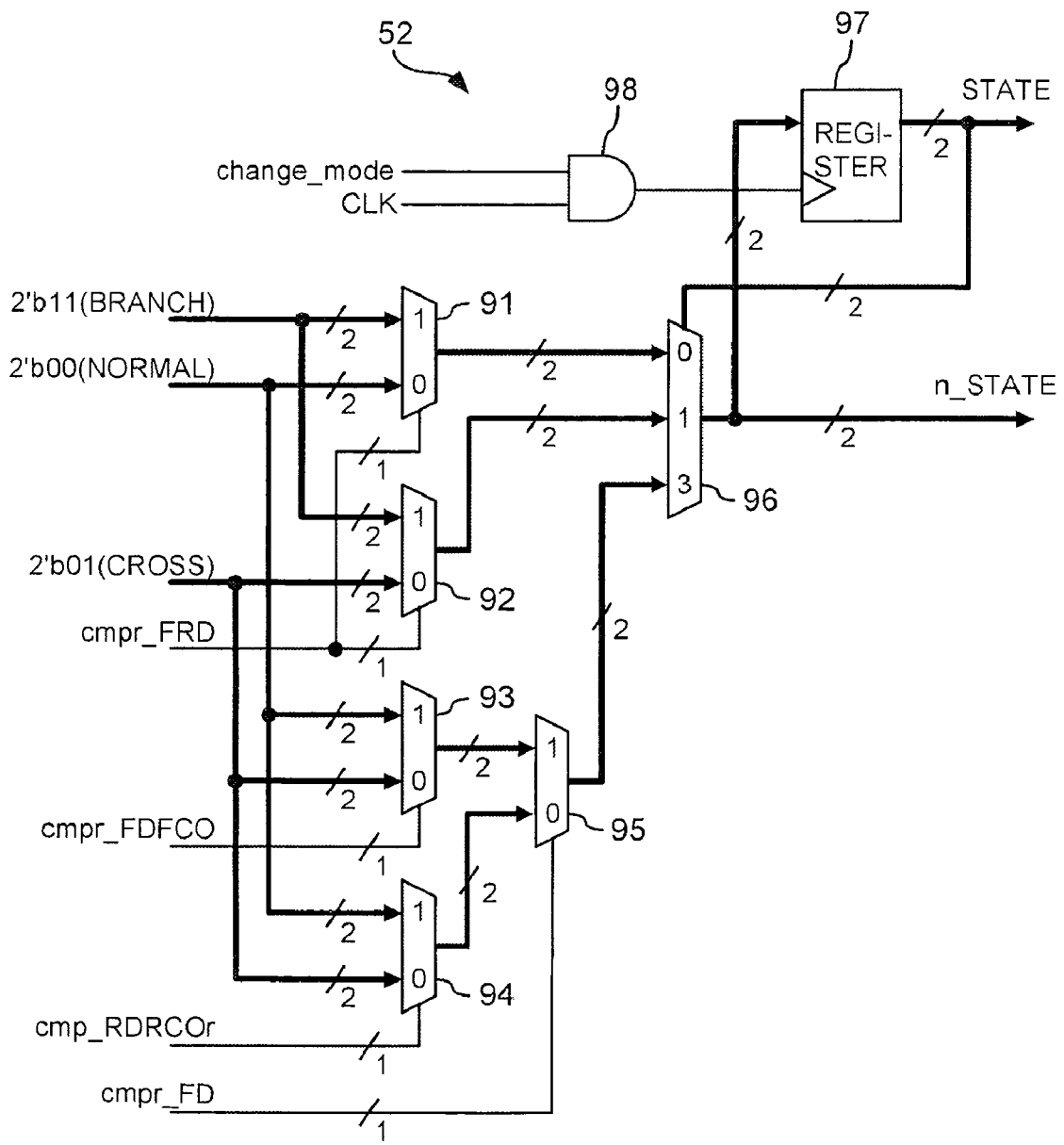
FIG. 8 is a circuit diagram of an exemplary configuration of a state machine circuit.

FIG. 8 is a circuit diagram of an exemplary configuration of the state machine circuit 52. The state machine circuit 52 is configured to include selection circuits 91 to 96, a register 97, and an AND circuit 98.

The selection circuit 91 receives a 2-bit signal "11" indicative of the branch state and a 2-bit signal "00" indicative of the normal state. The selection circuit 91 further receives the signal cmpr_FRD as a signal for selecting the output signal. For example, the selection circuit 91 issues the signal "00" indicative of the normal state when the signal cmpr_FRD is low (0), whereas it issues the signal "11" indicative of the branch state when the signal cmpr_FRD is high (1).

The selection circuit 92 receives the 2-bit signal "11" indicative of the branch state and a 2-bit signal "01" indicative of the cross state. The selection circuit 92 further receives the signal cmpr_FRD as the signal for selecting the output signal. For example, the selection circuit 92 issues the signal "01" indicative of the cross state when the signal cmpr_FRD is low (0), whereas it issues the signal "11" indicative of the branch state when the signal cmpr_FRD is high (1).

The selection circuit 93 receives the 2-bit signal "00" indicative of the normal state and the 2-bit signal "01" indicative of the cross state. The selection circuit 93 further receives the signal cmpr_FDFCO as the signal for selecting the output signal. For example, the selection circuit 93 issues the signal "01" indicative of the cross state when the signal cmpr_FDFCO is low (0), whereas it issues the signal "00" indicative of the normal state when the signal cmpr_FDFCO is high (1).

The selection circuit 94 receives the 2-bit signal "00" indicative of the normal state and the 2-bit signal "01" indicative of the cross state. The selection circuit 94 further receives the signal cmpr_RDRCO as the signal for selecting the output signal. For example, the selection circuit 94 issues the signal "01" indicative of the cross state when the signal cmpr RDRCO is low (0), whereas it issues the signal "00" indicative of the normal state when the signal cmpr_RDRCO is high (1).

The selection circuit 95 receives the signals fed from the selection circuits 93 and 94. The selection circuit 95 further receives the signal cmpr_FD as the signal for selecting the output signal. For example, the selection circuit 95 issues the signal fed from the selection circuit 94 when the signal cmpr_FD is low (0), whereas it issues the signal fed from the selection circuit 93 when the signal cmpr_FD is high (1).

The selection circuit 96 receives the signals fed from the selection circuits 91, 92, and 95. The selection circuit 96 further receives the signal STATE of 2 bits as the signal for selecting the output signal. For example, the selection circuit 96 issues the signal fed from the selection circuit 91 when the signal STATE is "00" (0), issues the signal fed from the selection circuit 92 when the signal STATE is "01" (1), and issues the signal fed from the selection circuit 95 when the signal STATE is "11" (3). The signal issued from the selection circuit 96 is the signal n_STATE.

The signals issued from the selection circuit 96 are fed to a data input of the register 97. The signal change_mode and the clock signal CLK are fed to the AND circuit 98 whose output is provided to a clock input of the register 97. Thus, the signal n_STATE from the selection circuit 96 is delivered to the register 97 at the timing when the signal change_mode changes from low to high for example. The register 97 is comprised of the gated clock, and the signal STATE changes at the next timing when the clock signal CLK changes from low to high.

Figure 9:
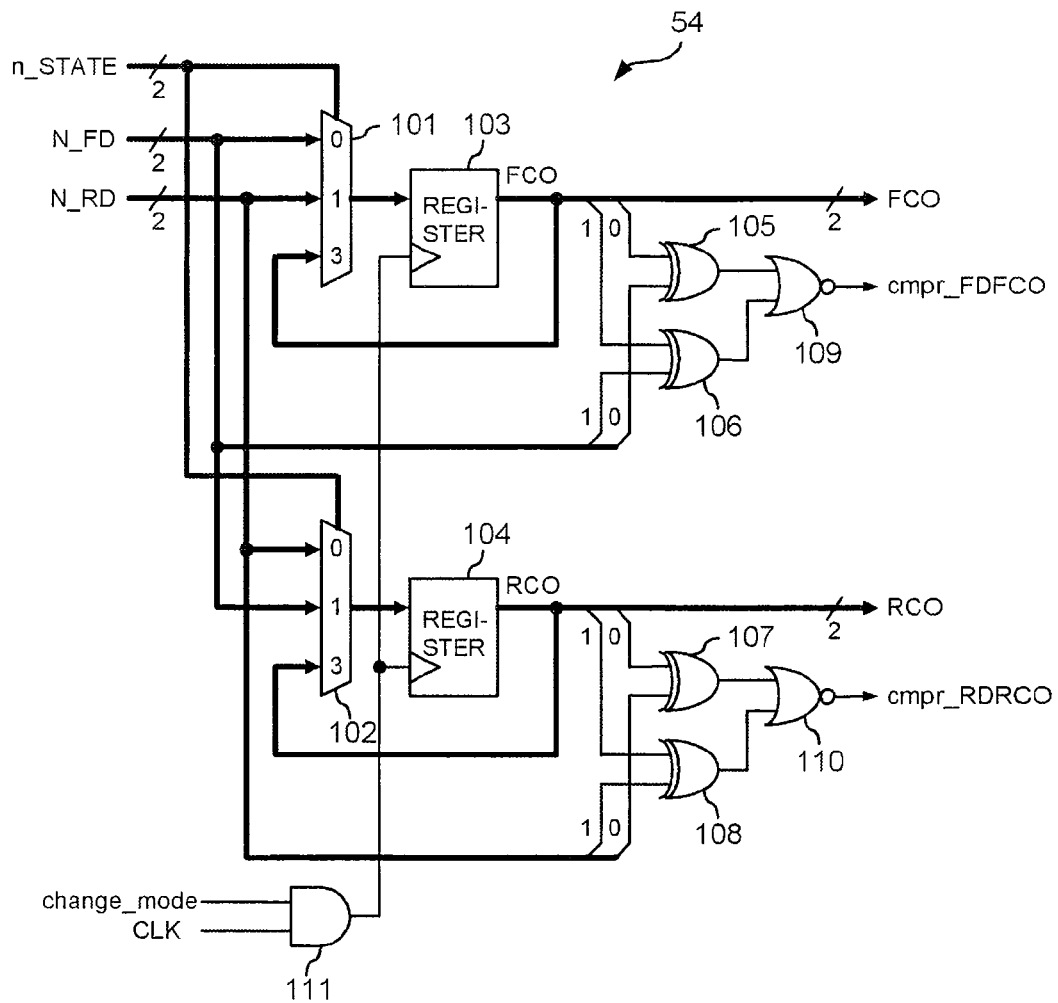
FIG. 9 depicts an exemplary configuration of a decode circuit A.

FIG. 9 depicts an exemplary configuration of the decode circuit A 54. The decode circuit A 54 is configured to include selection circuits 101 and 102, registers 103 and 104, XOR circuits 105 to 108, NOR circuits 109 and 110, and an AND circuit 111.

The selection circuit 101 receives the signals N_FD and N_RD, as well as the signal FCO issued from the register 103. The selection circuit 101 receives the signal n_STATE as the signal for selecting the output signal. For example, the selection circuit 101 issues the signal N_FD when the signal n_STATE is "00" (0), issues the signal N_RD when the signal n_STATE is "01" (1), and issues the signal FCO when the signal n_STATE is "11" (3).

The selection circuit 102 receives the signals N_FD and N_RD, as well as the signal RCO issued from the register 104. The selection circuit 102 receives the signal n_STATE as the signal for selecting the output signal. For example, the selection circuit 102 issues the signal N_RD when the signal n_STATE is "00" (0), issues the signal N_FD when the signal n_STATE is "01" (1), and issues the signal RCO when the signal n_STATE is "11" (3).

The signals issued from the selection circuit 101 are fed to a data input of the register 103. The signals issued from the selection circuit 102 are fed to a data input of the register 104. The signal change_mode and the clock signal CLK are fed to the AND circuit 111 whose output is provided to clock inputs of the registers 103 and 104. Thus, at the timing when the signal change_mode changes from low to high for example, the signals from the selection circuit 101 are delivered to the register 103 while the signals from the selection circuit 102 are delivered to the register 104. The registers 103 and 104 are each comprised of the gated clock, and the signals FCO and RCO issued from the registers 103 and 104, respectively, are changed at the next timing when the clock signal CLK changes from low to high.

The XOR circuits 105 and 106, and the NOR circuit 109 are circuits comparing the signal N_FD with the signal FCO, the NOR circuit 109 issuing the signal cmpr_FDFCO indicative of the result of comparison. In this embodiment, the signal cmpr_FDFCO goes high when the signals N_FD and FCO are the same, whereas the signal cmpr_FDFCO goes low when they are different.

The XOR circuits 107 and 108, and the NOR circuit 110 are circuits comparing the signal N_RD with the signal RCO, the NOR circuit 110 issuing the signal cmpr_RDRCO indicative of the result of comparison. In this embodiment, the signal cmpr_RDRCO goes high when the signals N_RD and RCO are the same, whereas the signal cmpr_RDRCO goes low when they are different.

Figure 10:
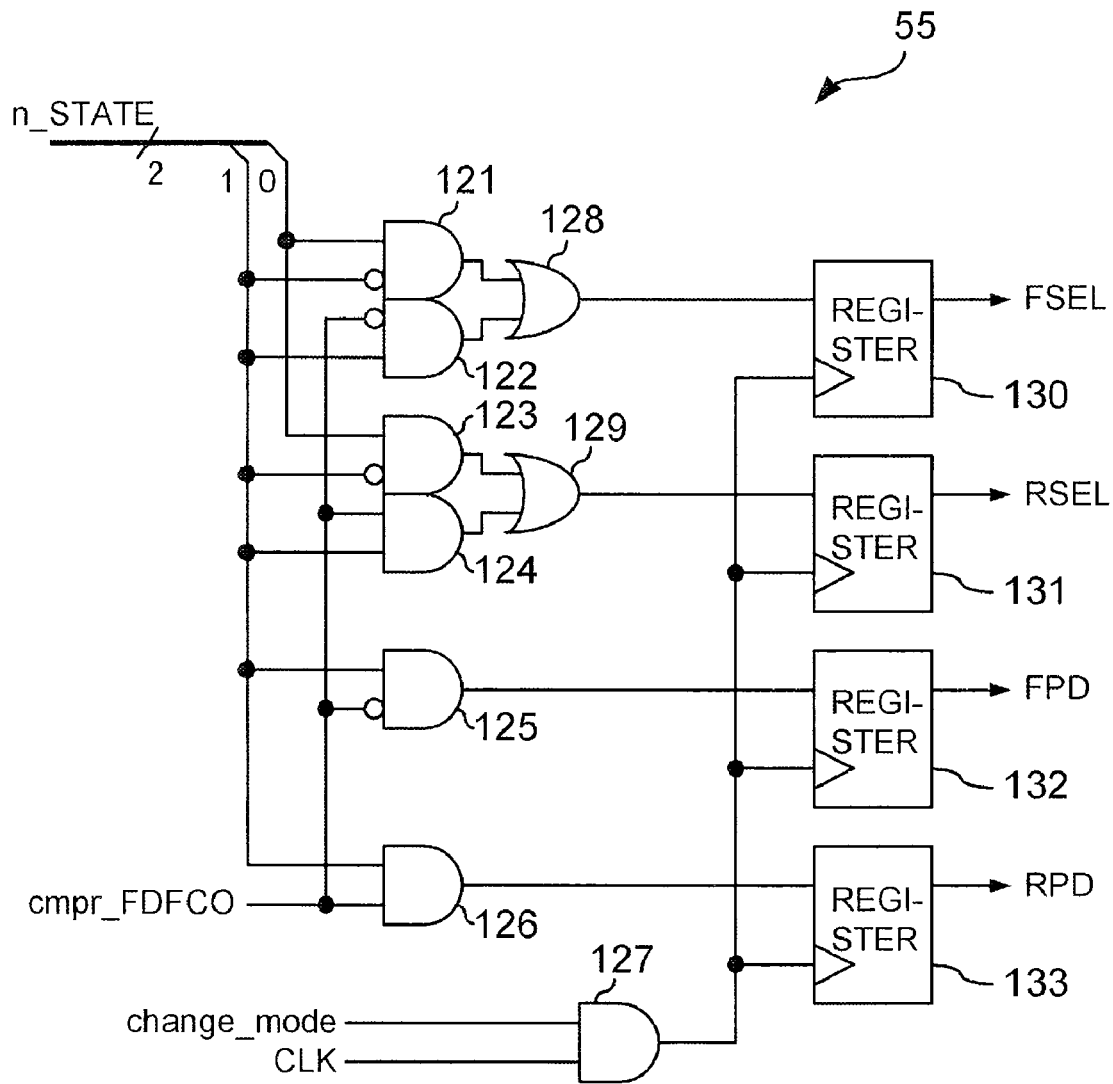
FIG. 10 depicts an exemplary configuration of a decode circuit B.

FIG. 10 depicts an exemplary configuration of the decode circuit B 55. The decode circuit B 55 is configured to include AND circuits 121 to 127, OR circuits 128 and 129, and registers 130 to 133.

The AND circuit 121 receives the 0th bit of the signal n_STATE and the inversion of the 1st bit of the signal n_STATE. Thus, the output of the AND circuit 121 goes to "1" when the signal n_STATE is "01" (cross state). The AND circuit 122 receives the 1st bit of the signal n_STATE and the inversion of the signal cmpr_FDFCO. Thus, the output of the AND circuit 122 goes to "1" when the signal n_STATE is "11" (branch state) and when the signal N_FD indicative of the sound source of the front output changed is different from the signal FCO that is a selection signal for the analog selector 31. The outputs from the AND circuits 121 and 122 are provided to the OR circuit 128 whose output is fed to a data input of the register 130.

The AND circuit 123 receives the 0th bit of the signal n_STATE and the inversion of the 1st bit of the signal n_STATE. Thus, the output of the AND circuit 123 goes to "1" when the signal n_STATE is "01" (cross state). The AND circuit 124 receives the 1st bit of the signal n_STATE and the signal cmpr_FDFCO. Thus, the output of the AND circuit 124 goes to "1" when the signal n_STATE is "11" (branch state) and when the signal N_FD indicative of the sound source of the front output changed is the same as the signal FCO that is a selection signal for the analog selector 31. The outputs from the AND circuits 123 and 124 are provided to the OR circuit 129 whose output is fed to a data input of the register 131.

The AND circuit 125 receives the 1st bit of the signal n_STATE and the inversion of the signal cmpr_FDFCO. Thus, the output of the AND circuit 125 goes to "1" when the signal n_STATE is "11" (branch state) and when the signal N_FD indicative of the sound source of the front output changed is different from the signal FCO that is a selection signal for the analog selector 31. The output of the AND circuit 125 is provided to a data input of the register 132.

The AND circuit 126 receives the 1st bit of the signal n_STATE and the signal cmpr_FDFCO. Thus, the output of the AND circuit 126 goes to "1" when the signal n_STATE is "11" (branch state) and when the signal N_FD indicative of the sound source of the front output changed is the same as the signal FCO that is a selection signal for the analog selector 31. The output of the AND circuit 126 is provided to a data input of the register 133.

The AND circuit 127 receives the signal change_mode and the clock signal CLK. The output of the AND circuit 127 is provided to clock inputs of the registers 130 to 133. Thus, at the timing when the signal change_mode changes from low to high for example, the signals from the OR circuits 128 and 129 are delivered to the registers 130 and 131, respectively, while the signals from the AND circuits 125 and 126 are delivered to the registers 132 and 133, respectively. The registers 130 to 133 are each comprised of the gated clock, and the signals FSEL, RSEL, FPD, and RPD issued from the registers 130 to 133, respectively, are changed at the next timing when the clock signal CLK changes from low to high.

Figure 11:
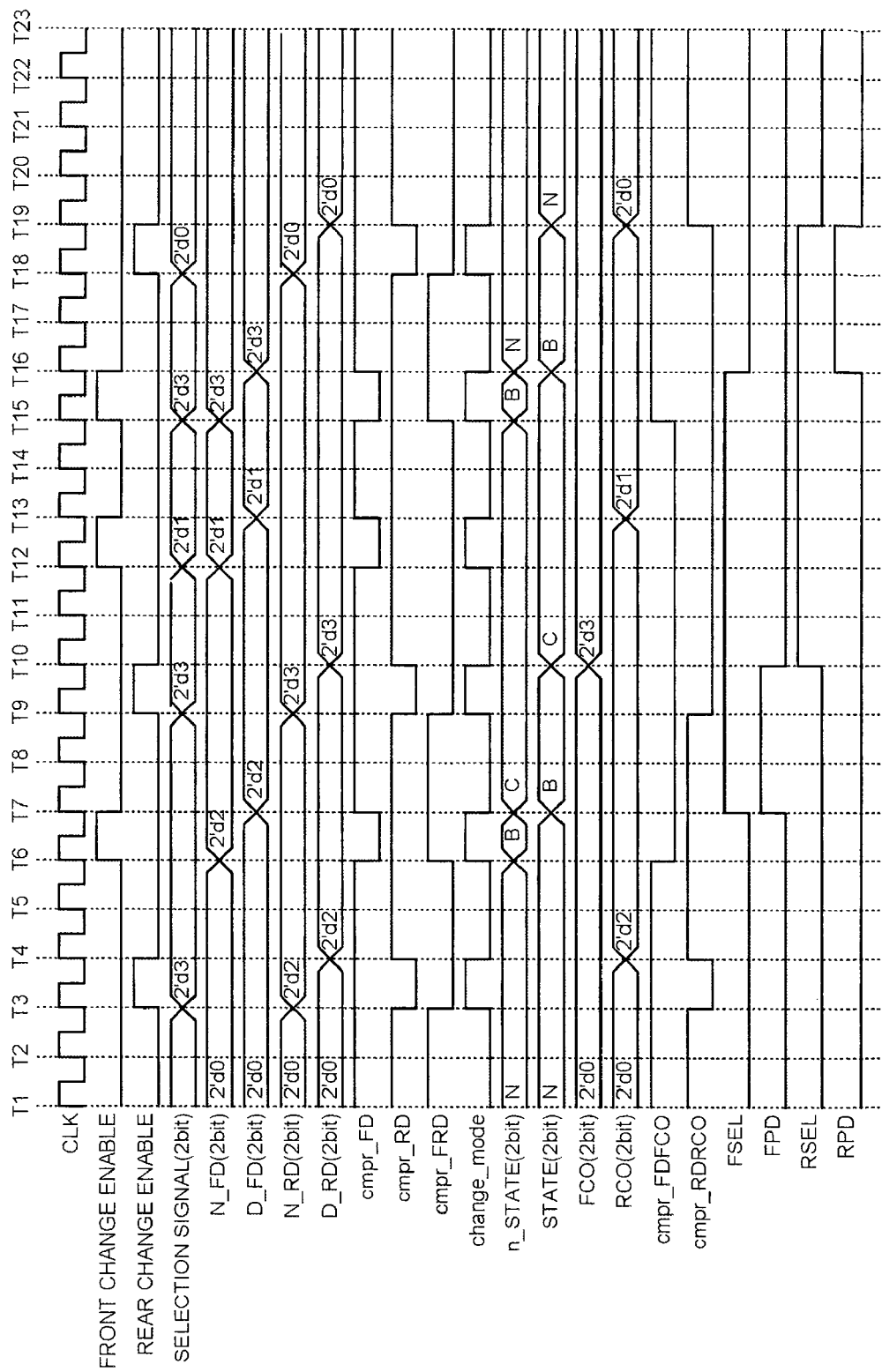
FIG. 11 is a timing chart of an exemplary operation of the control circuit.

FIG. 11 is a timing chart of an exemplary operation of the control circuit 36. In the initial state, the state of selection is normal state (N) at time T1 so that the input 0 is provided as both the front output and the rear output.

When a control signal to provide the input 2 as the rear output is sent from the microcontroller 21 at time T3, the decode circuit 61 issues a selection signal "10" (2) and feeds a high signal to the rear change enable signal. When the rear change enable signal goes high (1), the signal N_RD issued from the selection circuit 67 turns to the selection signal "10" (2) from the decode circuit 61. At that time, the signal D_RD issued from the register 63 is "00" (0), allowing the signal cmpr_RD to go low.

At this timing, the selection signal "10" (2) is delivered to the register 63. Since the front change enable signal is low (0), the signal N_FD issued from the selection circuit 66 is the signal D_FD, with the signal cmpr_FD being high. Thus, the signal change_mode goes high. The signal N_FD and the signal N_RD are different, so that the signal cmpr_FRD goes low.

Due to the signal cmpr_FRD being low (0) with the signal STATE of "00" (NORMAL), the signal n_STATE remains unchanged, i.e., keeps "00" (NORMAL).

Since the signal n_STATE is "00" (0), the signal issued from the selection circuit 101 is the signal N_FD so that "00" is delivered to the register 103. Similarly, the signal issued from the selection circuit 102 is N_RD so that "10" is delivered to the register 104. The signal N_RD is "10" with the signal RCO of "00" issued from the register 104, allowing the signal cmpr_RDRCO to go low. The signal n_STATE is "00" and the signal cmpr_FDFCO is high, so that "0" is fed to the registers 130 to 133.

Afterward, at time T4, the signal D_RD issued from the register 63 goes to "10" (2). In response to this, the signal cmpr_RD goes high and the signal change_mode goes low. The signal RCO issued from the register 104 goes to "10" (2), in response to which the signal cmpr_RDRCO goes high.

Since the signal n_STATE is "00" (NORMAL) at time T3, the signal STATE remains "00" (NORMAL). All of the signals FSEL, FPD, RSEL, and RPD then go to "0" so that the input 0 selected by the analog selector 31 is provided as the front output and that the input 2 selected by the analog selector 32 is provided as the rear output.

In this manner, when changing over the rear output to a different sound source from that of the front output in the state (normal state) where the front output and the rear output are different, switching of the analog selector 31 is not carried out, so that no noise arises on the front output side.

When a control signal to provide the input 2 as the front output is then sent from the microcontroller 21 at time T6, the decode circuit 61 issues a selection signal "10" (2) and feeds a high signal to the front change enable signal. When the front change enable signal goes high (1), the signal N_FD issued from the selection circuit 66 turns to the selection signal "10" (2) from the decode circuit 61. At that time, the signal D_FD issued from the register 62 is "00" (0), allowing the signal cmpr_FD to go low.

At this timing, the selection signal "10" (2) is delivered to the register 62. Since the rear change enable signal is low (0), the signal N_RD issued from the selection circuit 67 is the signal D_RD, with the signal cmpr_RD being high. Thus, the signal change_mode goes high. The signal N_FD and the signal N_RD are the same, so that the signal cmpr_FRD goes high.

Due to the signal cmpr_FRD being high (1) with the signal STATE of "00" (NORMAL), the signal n_STATE goes to "11" (BRANCH).

Since the signal n_STATE is "11" (3), the signal issued from the selection circuit 101 is the signal FCO so that "00" is delivered to the register 103. Similarly, the signal issued from the selection circuit 102 is the signal RCO so that "10" is delivered to the register 104. The signal N_FD is "10" with the signal FCO of "00" issued from the register 103, allowing the signal cmpr_FDFCO to go low. The signal n_STATE is "11" and the signal cmpr_FDFCO is low, so that "1" is fed to the registers 130 and 132 with "0" fed to the registers 131 and 133.

Afterward, at time T7, the signal D_FD issued from the register 62 goes to "10" (2). In response to this, the signal cmpr_FD goes high and the signal change_mode goes low. Since the signal n_STATE is 11 (BRANCH) at time T6, the signal STATE goes to "11" (BRANCH). When the signal STATE goes to "11" (3), the signal n_STATE goes to "01" (CROSS) since the signal cmpr_FD is high (1) with the signal cmpr_FDFCO being low (0). Then, the signals FSEL and FPD go to "1" while the signals RSEL and RPD go to "0". Thus, the input 2 selected by the analog selector 32 is provided as the front output and as the rear output, with the result that the operation of the ADC 33 becomes powered down.

Thus, when changing over the front output to the same sound source as that of the rear output from the state (normal state) where the front output and the rear output are different, the analog selectors 31 and 32 do not select the same sound source so that no noise arises on the rear output side. Due to the operation of the ADC 33 becoming powered down, the power consumption can be reduced.

When a control signal to provide the input 3 as the rear output is then sent from the microcontroller 21 at time T9, the decode circuit 61 issues a selection signal "11" (3) and feeds a high signal to the rear change enable signal. When the rear change enable signal goes high (1), the signal N_RD issued from the selection circuit 67 turns to the selection signal "11"

(3) from the decode circuit 61. At that time, the signal D_RD issued from the register 63 is "10" (2), allowing the signal cmpr_RD to go low.

At this timing, the selection signal "11" (3) is delivered to the register 63. Since the front change enable signal is low (0), the signal N_FD issued from the selection circuit 66 is the signal D_FD, with the signal cmpr_FD being high. Thus, the signal change_mode goes high. The signal N_FD and the signal N_RD are different, so that the signal cmpr_FRD goes low.

Due to the signal cmpr_FRD being low (0) and the signal cmpr_FD being high (1) with the signal STATE of "11" (BRANCH), the signal n_STATE remains "01" (CROSS).

Since the signal n_STATE is "01" (1), the signal issued from the selection circuit 101 is the signal N_RD so that "11" is delivered to the register 103. On the other hand, the signal issued from the selection circuit 102 is the signal N_FD so that "10" is delivered to the register 104. The signal N_RD is "11" with the signal RCO of "10" issued from the register 104, allowing the signal cmpr_RDRCO to go low. The signal n_STATE is "01" and the signal cmpr_FDFCO is low, so that "1" is fed to the registers 130 and 131 with "0" fed to the registers 132 and 133.

Afterward, at time T10, the signal D_RD issued from the register 63 goes to "11" (3). In response to this, the signal cmpr_RD goes high and the signal change_mode goes low. At this timing, the signal FCO issued from the register 103 goes to "11" (3). Since the signal n_STATE is "01" (CROSS) at time T9, the signal STATE goes to "01" (CROSS). Then, the signals FSEL and RSEL go to "1" while the signals FPD and RPD go to "0". Thus, the input 3 selected by the analog selector 31 is provided as the rear output and the input 2 selected by the analog selector 32 is provided as the front output.

Thus, when changing over the rear output to a different sound source from that of the front output from the state (branch state) where the front output and the rear output are the same, the analog selector 32 currently selecting the front output need not be switched, with the result that no noise arises on the front output side.

When a control signal to provide the input 1 as the front output is then sent from the microcontroller 21 at time T12, the decode circuit 61 issues a selection signal "01" (1) and feeds a high signal to the front change enable signal. When the front change enable signal goes high (1), the signal N_FD issued from the selection circuit 66 turns to the selection signal "01" (1) from the decode circuit 61. At that time, the signal D_FD issued from the register 62 is "10" (2), allowing the signal cmpr_FD to go low.

At this timing, the selection signal "01" (1) is delivered to the register 62. Since the rear change enable signal is low (0), the signal N_RD issued from the selection circuit 67 is the signal D_RD, with the signal cmpr_RD being high. Thus, the signal change_mode goes high. The signal N_FD and the signal N_RD are different, so that the signal cmpr_FRD remains low.

Due to the signals cmpr_FRD and cmpr_FD being both low (0) with the signal STATE of "01" (CROSS), the signal n_STATE still keeps "01" (CROSS).

Since the signal n_STATE is "01" (1), the signal issued from the selection circuit 101 is the signal N_RD so that "11" is delivered to the register 103. On the other hand, the signal issued from the selection circuit 102 is the signal N_FD so that "01" is delivered to the register 104. The signal n_STATE is "01" and the signal cmpr_FDFCO is low, so that "1" is fed to the registers 130 and 131 with "0" fed to the registers 132 and 133.

Afterward, at time T13, the signal D_FD issued from the register 62 goes to "01" (1). In response to this, the signal cmpr_FD goes high and the signal change_mode goes low. The signal RCO issued from the register 104 goes to "01" (1). Since the signal n_STATE is "01" (CROSS) at time T12, the signal STATE still keeps "01" (CROSS). Then, the signals FSEL and RSEL remains "1" while the signals FPD and RPD remains "0". Thus, the input 3 selected by the analog selector 31 is provided as the rear output and the input 1 selected by the analog selector 32 is provided as the front output.

Thus, when changing over the front output to a different sound source from that of the rear output in the state (cross state) where the front output and the rear output are different, switching of the analog selector 31 does not occur, with the result that no noise arises on the rear output side.

When a control signal to provide the input 3 as the front output is then sent from the microcontroller 21 at time T15, the decode circuit 61 issues a selection signal "11" (3) and feeds a high signal to the front change enable signal. When the front change enable signal goes high (1), the signal N_FD issued from the selection circuit 66 turns to the selection signal "11" (3) from the decode circuit 61. At that time, the signal D_FD issued from the register 62 is "01" (1), allowing the signal cmpr_FD to go low.

At this timing, the selection signal "11" (3) is delivered to the register 62. Since the rear change enable signal is low (0), the signal N_RD issued from the selection circuit 67 is the signal D_RD, with the signal cmpr_RD being high. Thus, the signal change_mode goes high. The signal N_FD and the signal N_RD are the same, so that the signal cmpr_FRD goes high.

Due to the signals cmpr_FRD being high (1) with the signal STATE of "01" (CROSS), the signal n_STATE goes to "11" (BRANCH).

Since the signal n_STATE is "11" (3), the signal issued from the selection circuit 101 is the signal FCO so that "11" is delivered to the register 103. Similarly, the signal issued from the selection circuit 102 is the signal RCO so that "01" is delivered to the register 104. Since the signal N_FD is "11" with the signal FCO of "03" issued from the register 103, the signal cmpr_FDFCO goes high. The signal n_STATE is "11" and the signal cmpr_FDFCO is high, so that "0" is fed to the registers 130 and 132 with "1" fed to the registers 131 and 133.

Afterward, at time T16, the signal D_FD issued from the register 62 goes to "11" (3). In response to this, the signal cmpr_FD goes high and the signal change_mode goes low. Since the signal n_STATE is "11" (BRANCH) at time T15, the signal STATE goes to "11" (BRANCH). Then, when the signal STATE goes to "11" (3), the signal n_STATE goes to "00" (NORMAL) due to both the signals cmpr_FD and cmpr_FDFCO being high (1). The signals FSEL and FPD go to "0" while the signals RSEL and RPD go to "1". Thus, the input 3 selected by the analog selector 31 is provided as the front output and as the rear output so that the operation of the ADC 34 becomes powered down.

Thus, when changing over the front output to the same sound source as that of the rear output from the state (cross state) where the front output and the rear output are different, the analog selectors 31 and 32 do not select the same sound source, with the result that no noise arises on the rear output side. Due to the operation of the ADC 34 becoming powered down, the power consumption can be reduced.

When a control signal to provide the input 0 as the rear output is then sent from the microcontroller 21 at time T18, the decode circuit 61 issues a selection signal "00" (0) and feeds a high signal to the rear change enable signal. When the rear change enable signal goes high (1), the signal N_RD issued from the selection circuit 67 turns to the selection signal "00" (0) from the decode circuit 61. At that time, the signal D_RD issued from the register 63 is "11" (3), allowing the signal cmpr_RD to go low.

At this timing, the selection signal "00" (0) is delivered to the register 63. Since the front change enable signal is low (0), the signal N_FD issued from the selection circuit 66 is the signal D_FD, with the signal cmpr_FD being high. Thus, the signal change_mode goes high. The signal N_FD and the signal N_RD are different, so that the signal cmpr_FRD goes low.

Due to both the signals cmpr_FD and cmpr_FDFCO being high (1) with the signal STATE of "11" (BRANCH), the signal n_STATE goes to "00" (NORMAL).

Since the signal n_STATE is "00" (0), the signal issued from the selection circuit 101 is the signal N_FD so that "11" is delivered to the register 103. Similarly, the signal issued from the selection circuit 102 is the signal N_RD so that "00" is delivered to the register 104. The signal n_STATE is "00" and the signal cmpr_FDFCO is high, so that "0" is fed to the registers 130 to 133.

Afterward, at time T19, the signal D_RD issued from the register 63 goes to "00" (0). In response to this, the signal cmpr_RD goes high and the signal change_mode goes low. Since the signal n_STATE is "00" (NORMAL) at time T18, the signal STATE goes to "00" (NORMAL). Then, all the signals FSEL, FPD, RSEL, and RPD go to "0" so that the input 3 selected by the analog selector 31 is provided as the front output while the input 0 selected by the analog selector 32 is provided as the rear output.

Thus, when changing over the rear output to a different sound source from that of the front output from the state (branch state) where the front output and the rear output are the same, the analog selector 31 currently selecting the front output need not be switched, with the result that no noise arises on the front output side.

==Example of Programmed Implementation==

Figure 12:
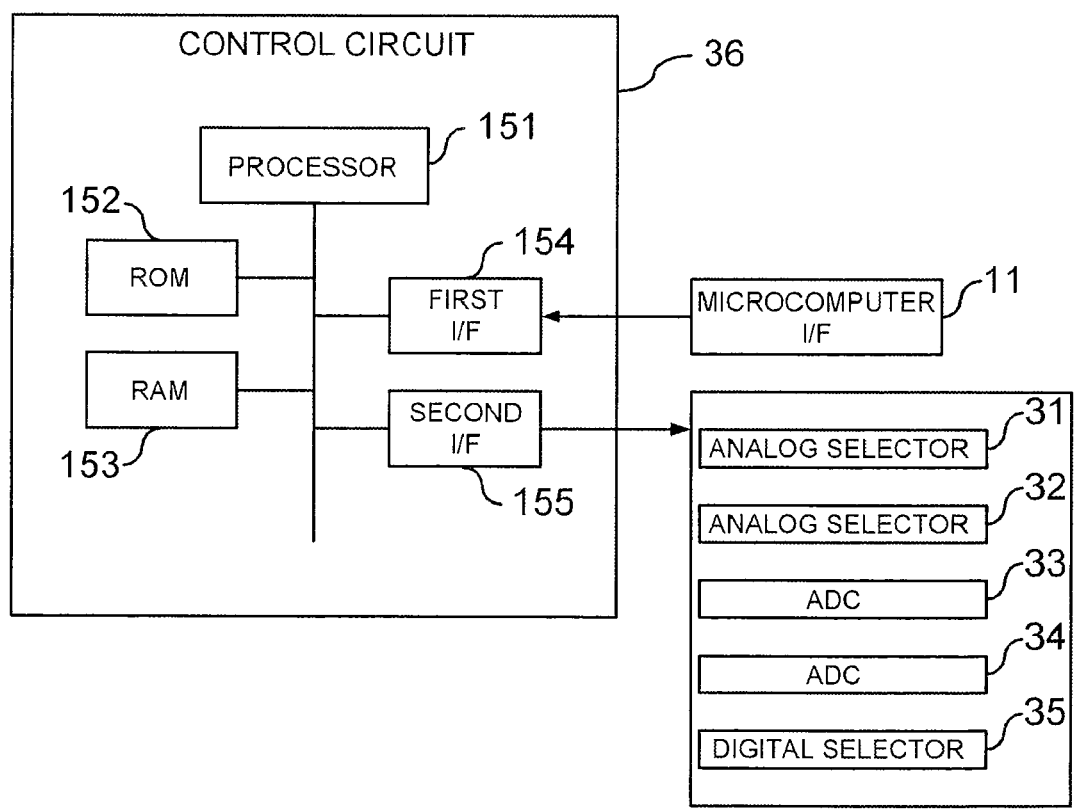
FIG. 12 depicts an exemplary configuration of the control circuit in case of providing a program-based control for the signal selecting circuit.

Description will then be made of the case of providing a programmed control for the signal selecting circuit 10. FIG. 12 depicts an exemplary configuration of the control circuit 36 in case of providing the programmed control for the signal selecting circuit 10. The control circuit 36 is configured to include a processor 151, a ROM (Read Only Memory) 152, a RAM (Random Access Memory) 153, a first interface (first I/F) 154, and a second interface (second I/F) 155.

The processor 151 reads and executes a program stored in the ROM 152, to thereby provide a control, etc., for the analog selectors 31 and 32, the ADCs 33 and 34, and the digital selector 35. An area to store the program is not limited to the ROM 152 but may be any nonvolatile storage area. A program read from an external nonvolatile memory area may be stored in a volatile memory area such as the RAM, for use. The RAM 153 stores temporary data, etc., used by the processor 151. An area to store the data is not limited to the RAM 153 but may be any writable memory area. The first I/F 154 serves to accept a control signal sent via the microcontroller I/F 11 from the microcontroller 21. The second I/F 155 serves to sent a control signal generated by the processor 151 to the analog selectors 31 and 32, the ADCs 33 and 34, and the digital selector 35.

Figure 13:
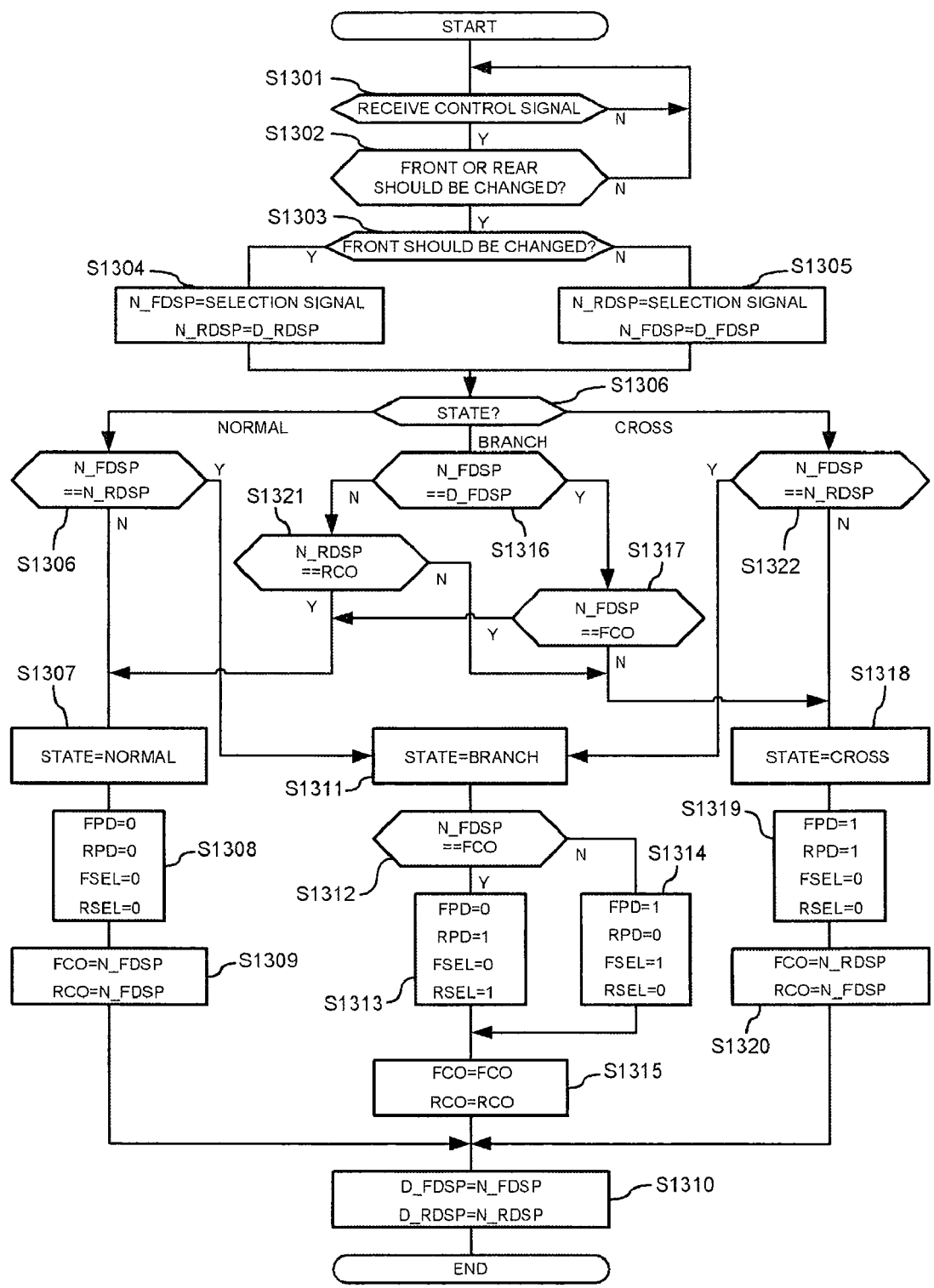
FIG. 13 is a flowchart of operations of the control circuit.
Figure 14:
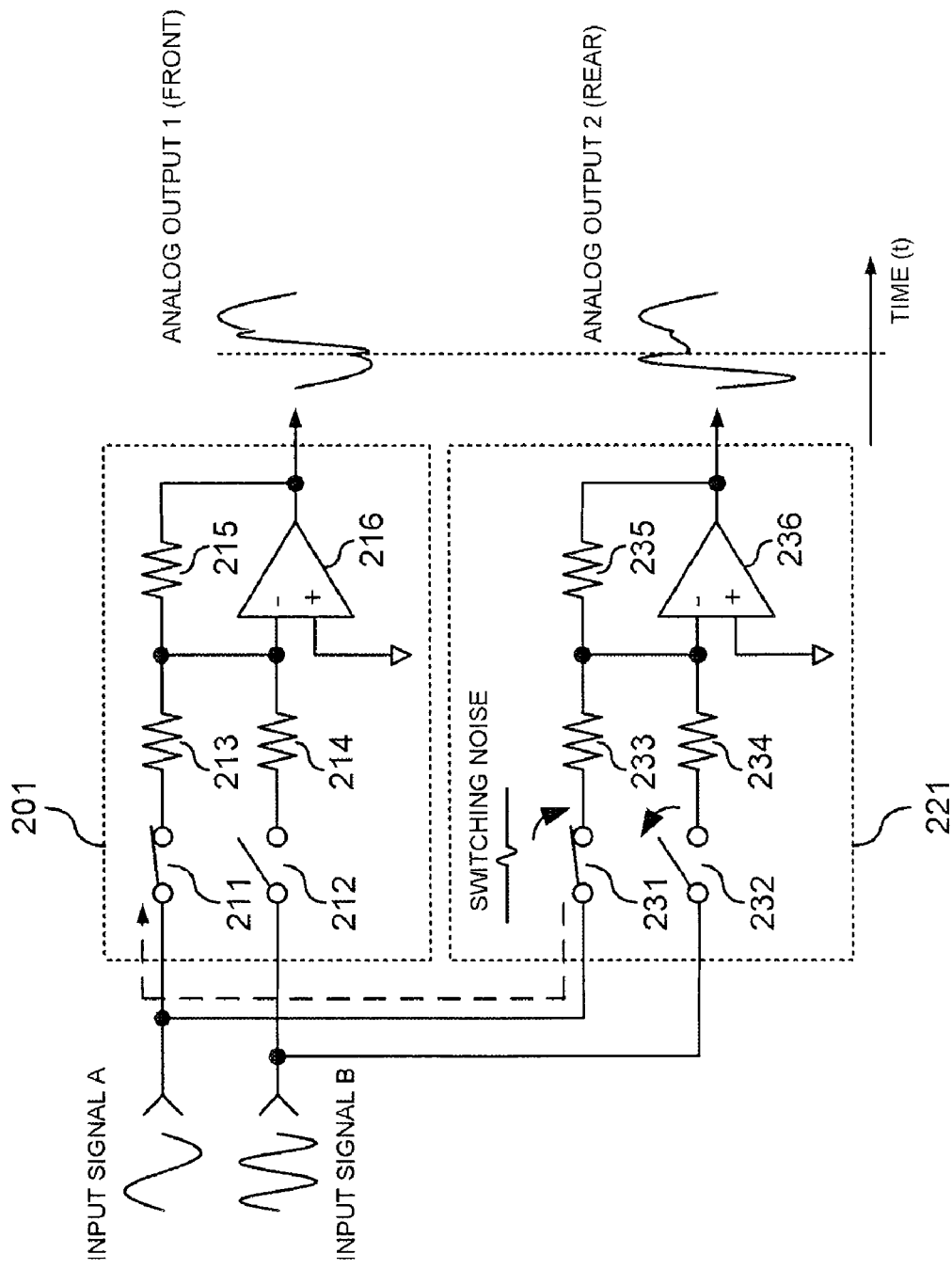
FIG. 14 depicts a common configuration example of an analog selector for selecting sound sources to be outputted to front speakers and rear speakers.

FIG. 13 is a flowchart of operations of the control circuit 36. The processor 151 checks whether a control signal is received from the microcontroller 21 (S1301). When receiving the control signal (S1301:Y), the processor 151 checks whether either the front output or the rear output should be changed (S1302). If neither of the outputs should be changed (S1302:N), then the processor 151 does not perform a changing operation, returning to the control signal checking operation (S1301).

If either the front output or the rear output should be changed (S1302:Y), then the processor 151 checks whether the front output should be changed (S1303). If affirmative, i.e., if the front output should be changed (S1303:Y), then processor 151 sets a selection signal after change specified by the control signal sent from the microcontroller 21 as a variable N_FDSP indicative of the front output after change and sets the value of a variable D_RDSP indicative of the current rear output stored in the RAM 153 as a variable N_RDSP indicative of the rear output after change (S1304). If negative, i.e., if the rear output should be changed (S1303:N), then processor 151 sets as the variable N_RDSP a selection signal after change specified by the control signal sent from the microcontroller 21 and sets as the variable N_FDSP the value of the variable D_FDSP indicative of the current front output stored in the RAM 153 (S1305).

The processor 151 then checks a variable STATE indicative of the current state of selection stored in the RAM 153 (S1306). If the current state of selection is normal state (S1306:NORMAL), then the processor 151 checks whether the front output and the rear output are the same after change (S1306). If negative, i.e., if the front output and the rear output are different after change (S1306: N), then the processor 151 updates the state of selection to the normal state (S1307). The processor 151 then sets the control signals (FPD, RPD, FSEL, RSEL) to (0, 0, 0, 0), respectively (S1308), and sets the control signals (FCO, RCO) to (N_FDSP, N_RDSP), respectively (S1309). The control signals FPD, RPD, FSEL, and RSEL are fed to the ADCs 33 and 34 and the digital selector 35 while the control signals FCO and RCO are fed to the analog selectors 31 and 32. The processor 151 sets the value of the variable N_FDSP as the variable D_FDSP and sets the value of the variable N_RDSP as the variable D_RDSP (S1310).

On the contrary, if the front output and the rear output are the same after change (S1306:Y), then the processor 151 updates the state of selection to the branch state (S1311). The processor 151 then checks whether the front output after change is the same as the current output of the analog selector 31 (S1312). If affirmative, i.e., if the front output after change is the same as the current output of the analog selector 31 (S1312:Y), then the processor 151 sets the control signals (FPD, RPD, FSEL, RSEL) to (0, 1, 0, 1), respectively (S1313). In this case, the operation of the ADC 34 is powered down so that the output of the analog selector 31 is provided as the front output and as the rear output. If the front output after change is different from the current output of the analog selector 31, i.e., if the front output after change is the same as the current output of the analog selector 32 (S1312:N), then the processor 151 sets the control signals (FPD, RPD, FSEL, RSEL) to (1, 0, 1, 0), respectively (S1314). In this case, the operation of the ADC 33 is powered down so that the output of the analog selector 32 is provided as the front output and as the rear output. The processor 151 outputs the control signals (FCO, RCO) intactly without changing (S1315). The processor 151 then updates the variables D_FDSP and D_RDSP (S1310). In this manner, when changing the state from the state (normal state) where the front output and the rear output are different to the state where they are the same, control is provided by switching the digital selector 35 instead of selecting the same signal by the analog selectors 31 and 32. This prevents occurrence of a noise due to the selection of the same signal by the analog selectors 31 and 32 and propagation of the noise to the side not changing the output.

If the state of selection is the branch state (S1306: BRANCH) when the control signal is received, then the processor 151 checks whether the front output should be changed (S1316). If the front output should not be changed, i.e., if the rear output should be changed (S1316:Y), then the processor 151 checks whether the front output is the same as the current output of the analog selector 31 (S1317). If affirmative, i.e., if the front output is the same as the current output of the analog selector 31 (S1317:Y), then the processor 151 executes the above processes (S1307 to S1310). In this case, the state of selection transitions to the normal state.

On the contrary, if the front output is different from the current output of the analog selector 31, i.e., if the front output is the same as the current output of the analog selector 32 (S1317:N), then the processor 151 updates the state of selection to the cross state (S1318). The processor 151 then sets the control signals (FPD, RPD, FSEL, RSEL) to (1, 1, 0, 0), respectively (S1319), and sets the control signals (FCO, RCO) to (N_RDSP, N_FDSP), respectively (S1320). Then, the control signals FPD, RPD, FSEL, and RSEL are fed to the ADCs 33 and 34 and the digital selector 35, while the control signals FCO and RCO are fed to the analog selectors 31 and 32. The processor 151 updates the variables D_FDSP and D_RDSP (S1310). In this case, the output of the analog selector 32 is provided as the front output, while the output of the analog selector 31 is provided as the rear output. Thus, by enabling the state of selection to transition from the branch state to the cross state, the analog selector 31 or 32 associated with unchanged one of the front and rear outputs need not be switched so that the unchanged output is not subjected to a noise attendant on the switching of the other.

If the front output should be changed in the branch state (S1316:N), then the processor 151 checks whether the rear output is the same as the current output of the analog selector 32 (S1321). If affirmative, i.e., if the rear output is the same as the current output of the analog selector 32 (S1321:Y), then the processor 151 executes the above processes (S1307 to S1310). In this case, the state of selection transitions to the normal state.

On the contrary, if the rear output is different from the current output of the analog register 32, i.e., if the rear output is the same as the current output of the analog register 31 (S1321:N), then the processor 151 executes the above processes (S1318 to S1320, and S1310). Thus, the state of selection transitions to the cross state. In this case also, the analog selector 31 or 32 associated with unchanged one of the front and rear outputs need not be switched so that the unchanged output is not subjected to a noise attendant on the switching of the other.

If the state of selection is cross state when the control signal is received (S1306:CROSS), then the processor 151 checks whether the front output and the rear output are the same after change (S1322). If negative, i.e., if the front output and the rear output are different after change (S1322:N), then the processor 151 executes the above processes (S1318 to S1320 and S1310). In this case, the state of selection remains the cross state.

On the contrary, if the front output and the rear output are the same after change (S1322:Y), then the processor 151 executes the above processes (S1311 to S1315 and S1310). That is, the state of selection transitions to the branch state. In this manner, when changing the state of selection from the state (cross state) where the front output and the rear output are different to the state where they are the same, control is provided by switching the digital selector 35 instead of selecting the same signal by the analog selectors 31 and 32. This prevents occurrence of a noise due to the selection of the same signal by the analog selectors 31 and 32 and propagation of the noise to the side not changing the output.

Description has been made of the vehicle-mounted audio reproduction circuit 1 configured to use the signal selecting circuit 10 of this embodiment. As described above, the signal selecting circuit 10 enables the state of selection to transition from the normal state to the branch state. That is, in case of changing over one of the front output and the rear output to the same sound source as that of the other from the state (normal state) where the front output and the rear output are different, the output can be changed over by switching the digital selector 35 without switching the analog selectors 31 and 32. Thus, since the analog selectors 31 and 32 do not select the same sound source, the noise cannot propagate to the unchanged output.

The signal selecting circuit 10 enables the state of selection to transition from the branch state to the cross state. That is, in case of changing over the front output to a different sound source from that of the rear output from the state (branch state) where a sound source selected by the analog selector 31 is provided as the front output and as the rear output, another sound source newly selected by the analog selector 32 is provided as the front output, with the sound source selected by the analog selector 31 being provided intactly as the rear output. Thus, since the analog selector 31 is not switched, a noise does not appear in the rear output. In case of changing over the rear output from the state (branch state) where a sound source selected by the analog selector 32 is provided as the front output and as the rear output, another sound source newly selected by the analog selector 31 is provided as the rear output, with the sound source selected by the analog selector 32 being provided intactly as the front output. Thus, since the analog selector 32 is not switched, a noise does not appear in the front output.

The signal selecting circuit 10 enables the state of selection to transition from the cross state to the branch state. That is, in case of changing over one of the front output and the rear output to the same sound source as that of the other from the state (cross state) where the front output and the rear output are different, the output can be changed over by switching the digital selector 35 without switching the analog selectors 31 and 32. Thus, since the analog selectors 31 and 32 do not select the same sound source, the noise cannot propagate to the unchanged output.

The signal selecting circuit 10 enables the state of selection to transition from the cross state to the cross state. In this case, the analog selector 31 or 32 selecting the unchanged output is not switched so that no noise appears in the unchanged output.

The signal selecting circuit 10 enables the state of selection to transition from the branch state to the normal state. In this case, the analog selector 31 or 32 selecting the unchanged output is not switched so that no noise appears in the unchanged output.

The signal selecting circuit 10 enables the state of selection to transition from the normal state to the normal state. In this case, the analog selector 31 or 32 selecting the unchanged output is not switched so that no noise appears in the unchanged output.

The signal selecting circuit 10 enables the operation of one of the ADCs 33 and 34 to be powered down in the branch state. This achieves a reduction in the power consumption of the signal selecting circuit 10. Although the operation of one of the ADCs 33 and 34 is powered down in this embodiment, the operation of one of the analog selectors 31 and 32 may be powered down in lieu of the ADCs 33 and 34.

The above embodiment of the present invention is simply for facilitating the understanding of the present invention and is not in any way to be construed as limiting the present invention. The present invention may variously be changed or altered without departing from the spirit thereof and encompasses equivalents thereof.

For example, although the signal selecting circuit 10 is applied to the vehicle-mounted audio reproduction circuit 1 by way of example in this embodiment, application of the signal selecting circuit 10 is not limited thereto. For example, an audio reproduction circuit may be configured that is capable of outputting the same sound source or different sound sources to speakers disposed in a plurality of rooms. Although the number of the analog selectors receiving a plurality of analog signals is two, i.e., the analog selectors 31 and 32 in this embodiment, three or more analog selectors may be employed. In case of the above audio reproduction circuit selecting sound sources outputted to the plurality of rooms, a corresponding number of analog selectors to the number of the rooms may be disposed to provide a control for each of the rooms.

What is claimed is:

1. A signal selecting circuit outputting a first and a second digital signals by convening a first and a second analog signals into digital signals, the first and the second analog signals being the same or different signals selected from a plurality of analog signals, the signal selecting circuit comprising:

an analog signal selection circuit that, based on an analog selection signal, selects the first and the second analog signals from the plurality of analog signals;

a first AD converter that converts the first analog signal outputted from the analog signal selection circuit into a third digital signal to output the third digital signal;

a second AD converter that converts the second analog signal outputted from the analog signal selection circuit into a fourth digital signal to output the fourth digital signal;

a digital signal selection circuit that, based on a digital selection signal, selectively outputs one or both of the third and the fourth digital signals as the first and the second digital signals; and a control circuit that, based on an output selection signal for selecting the first and the second digital signals, outputs the analog selection signal and the digital selection signal, wherein when the control circuit receives the output selection signal for changing the second digital signal to the same signal as the first digital signal, in a state where the third digital signal is outputted as the first digital signal and where the fourth digital signal is outputted as the second digital signal, the control circuit outputs the digital selection signal for outputting the third digital signal as the first and the second digital signals.

2. The signal selecting circuit of claim 1, wherein when the control circuit receives the output selection signal for changing the first digital signal to a signal different from the second digital signal, in a state where the third digital signal is outputted as the first and the second digital signals, the control circuit outputs the analog selection signal for selecting as the second analog signal an analog signal corresponding to the first digital signal indicated by the output selection signal, without changing the first analog signal.

3. The signal selecting circuit of claim 1, wherein when the control circuit receives the output selection signal for changing the first digital signal to the same signal as the second digital signal, in a state where the third digital signal is outputted as the second digital signal and where the fourth digital signal is outputted as the first digital signal, the control circuit outputs the digital selection signal for outputting the third digital signal as the first and the second digital signals.

4. The signal selecting circuit of claim 1, wherein when the control circuit receives the output selection signal for changing the first digital signal to a signal different from the second digital signal, in a state where the third digital signal is outputted as the second digital signal and where the fourth digital signal is outputted as the first digital signal, the control circuit outputs the analog selection signal for selecting as the second analog signal an analog signal corresponding to the first digital signal indicated by the output selection signal, without changing the first analog signal.

5. The signal selecting circuit of claim 1, wherein when control circuit receives the output selection signal for changing the second digital signal to a signal different from the first digital signal, in a state where the third digital signal is outputted as the first and the second digital signals, the control circuit outputs: the analog selection signal for selecting as the second analog signal an analog signal corresponding to the second digital signal indicated by the output selection signal, without changing the first analog signal; and the digital selection signal for outputting the third digital signal as the first digital signal and outputting the fourth digital signal as the second digital signal.

6. The signal selecting circuit of claim 1, wherein when the control circuit receives the output selection signal for changing the first digital signal to a signal different from the second digital signal, in a state where the third digital signal is outputted as the first digital signal and where the fourth digital signal is outputted as the second digital signal, the control circuit outputs the analog selection signal for selecting as the first analog signal an analog signal corresponding to the first digital signal indicated by the output selection signal.

7. The signal selecting circuit of claim 1, wherein when outputting the digital selection signal for outputting the third digital signal as the first and the second digital signals, the control circuit powers down an operation of the second AD converter.

8. A recording medium having a program recorded thereon, the program causing a processor of a signal selecting circuit which includes the processor that performs control for outputting a first and a second digital signals by convening a first and a second analog signals into digital signals, the first and the second analog signals being the same or different signals selected from a plurality of analog signals, an analog signal selection circuit that, based on an analog selection signal, selects the first and the second analog signals from the plurality of analog signals, a first AD converter that converts the first analog signal outputted from the analog signal selection circuit into a third digital signal to output the third digital signal, a second AD converter that converts the second analog signal outputted from the analog signal selection circuit into a fourth digital signal to output the fourth digital signal, a digital signal selection circuit that, based on a digital selection signal, selectively outputs one or both of the third and the fourth digital signals as the first and the second digital signals, and a memory that stores a state of selection of the third and the fourth digital signals in the digital signal selection circuit, to execute the steps of:

accepting an output selection signal for selecting the first and the second digital signals;

outputting the analog selection signal and the digital selection signal based on the output selection signal accepted and on the state of selection stored in the memory;

updating the state of selection stored in the memory; and when accepting the output selection signal for changing the second digital signal to the same signal as the first digital signal, in a state where the third digital signal is outputted as the first digital signal and where the fourth digital signal is outputted as the second digital signal, outputting the digital selection signal for outputting the third digital signal as the first and the second digital signals; and updating the state of selection stored in the memory.

9. The recording medium having a program recorded thereon of claim 8, the program causing the processor, to execute the steps of:

when accepting the output selection signal for changing the first digital signal to a signal different from the second digital signal, in a state where the third digital signal is outputted as the first and the second digital signals, outputting the analog selection signal for selecting as the second analog signal an analog signal corresponding to the first digital signal indicated by the output selection signal, without changing the first analog signal; and updating the state of selection stored in the memory.

10. The recording medium having a program recorded thereon of claim 8, the program causing the processor, to execute the steps of:

when accepting the output selection signal for changing the first digital signal to the same signal as the second digital signal, in a state where the third digital signal is outputted as the second digital signal and where the fourth digital signal is outputted as the first digital signal, outputting the digital selection signal for outputting the third digital signal as the first and the second digital signals; and updating the state of selection stored in the memory.

11. The recording medium having a program recorded thereon of claim 8, the program causing the processor, to execute the step of, when accepting the output selection signal for changing the first digital signal to a signal different from the second digital signal, in a state where the third digital signal is outputted as the second digital signal and where the fourth digital signal is outputted as the first digital signal, outputting the analog selection signal for selecting as the second analog signal an analog signal corresponding to the first digital signal indicated by the output selection signal, without changing the first analog signal.

12. The recording medium having a program recorded thereon of claim 8, the program causing the processor, to execute the steps of:

when accepting the output selection signal for changing the second digital signal to a signal different from the first digital signal, in a state where the third digital signal is outputted as the first and the second digital signals, outputting the analog selection signal for selecting as the second analog signal an analog signal corresponding to the second digital signal indicated by the output selection signal, without changing the first analog signal, and the digital selection signal for outputting the third digital signal as the first digital signal and outputting the fourth digital signal as the second digital signal; and updating the state of selection stored in the memory.

13. The recording medium having a program recorded thereon of claim 8, the program causing the processor, to execute the step of, when accepting the output selection signal for changing the first digital signal to a signal different from the second digital signal, in a state where the third digital signal is outputted as the first digital signal and where the fourth digital signal is outputted as the second digital signal, outputting the analog selection signal for selecting as the first analog signal an analog signal corresponding to the first digital signal indicated by the output selection signal.

14. The recording medium having a program recorded thereon of claim 8, the program causing the processor to execute the step of outputting a signal for powering down an operation of the second AD converter, when outputting the digital selection signal for outputting the third digital signal as the first and the second digital signals.

* * * * *

UNITED STATES PATENT AND TRADEMARK OFFICE
CERTIFICATE OF CORRECTION

PATENT NO. : 7,405,684 B2  Page 1 of 1
APPLICATION NO. : 11/611012
DATED : July 29, 2008
INVENTOR(S) : Kimura et al.

It is certified that error appears in the above-identified patent and that said Letters Patent is hereby corrected as shown below:

Column 21, line 24: replace "convening" with --converting--.

Column 22, line 58: replace "convening" with --converting--.

Signed and Sealed this

Twenty-third Day of September, 2008

JON W. DUDAS
*Director of the United States Patent and Trademark Office*